(12) United States Patent
Suzuki et al.

(10) Patent No.: US 8,017,920 B2
(45) Date of Patent: Sep. 13, 2011

(54) SPIN POLARIZED ION BEAM GENERATION APPARATUS AND SCATTERING SPECTROSCOPY APPARATUS USING THE SPIN POLARIZED ION BEAM AND SPECIMEN PROCESSING APPARATUS

(75) Inventors: Taku Suzuki, Tsukuba (JP); Yasushi Yamauchi, Tsukuba (JP)

(73) Assignee: Japan Science and Technology Agency, Saitama (JP)

( * ) Notice: Subject to any disclaimer, the term of this patent is extended or adjusted under 35 U.S.C. 154(b) by 228 days.

(21) Appl. No.: 12/516,351

(22) PCT Filed: Nov. 29, 2007

(86) PCT No.: PCT/JP2007/073121
§ 371 (c)(1),
(2), (4) Date: May 26, 2009

(87) PCT Pub. No.: WO2008/069110
PCT Pub. Date: Jun. 12, 2008

(65) Prior Publication Data
US 2010/0044564 A1 Feb. 25, 2010

(30) Foreign Application Priority Data

Nov. 29, 2006 (JP) ................................ 2006-321044
Jul. 23, 2007 (JP) ................................ 2007-190277

(51) Int. Cl.
*H01J 37/08* (2006.01)
*H01J 37/252* (2006.01)
(52) U.S. Cl. ................. 250/423 R; 250/423 P; 250/424; 250/425; 250/281; 250/288; 250/305; 250/309

(58) Field of Classification Search .................. 250/281, 250/288, 305, 309, 423 P, 423 R, 424, 425
See application file for complete search history.

(56) References Cited

U.S. PATENT DOCUMENTS
5,523,572 A * 6/1996 Nakanishi et al. ......... 250/423 P
(Continued)

FOREIGN PATENT DOCUMENTS
JP 2005-259476 A 9/2005

OTHER PUBLICATIONS
International Search Report (ISR) for PCT/JP2007/073121, citing Foreign Patent Documents No. 1 and Non-Patent Literature No. 2.
(Continued)

*Primary Examiner* — David A Vanore
(74) *Attorney, Agent, or Firm* — Chen Yoshimura LLP

(57) ABSTRACT

A spin polarized ion beam generation apparatus (30) can efficiently generate a spin polarized ion by using a pumping light generator (33) to an ion in a high frequency discharge tube (15) to irradiate optical pumping (33,34) by circularly polarized light and linearly polarized light orthogonal to each other to a metastable atom. For example, a polarized helium ion beam having a spin polarization rate that exceeds 18% and that is as high as 25% can be generated. The spin polarized ion beam generation apparatus (30) also can be applied to a processing apparatus and an analysis apparatus that can irradiate a polarized ion beam to a specimen. According to the spin polarized ion scattering spectroscopy apparatus, the spin status in a region at a depth of about 2 to 3 atomic layers from the surface of the specimen can be measured while discriminating the elements from the atomic layer with a reduced measurement time and with a high accuracy impossible in the conventional technique.

30 Claims, 19 Drawing Sheets

U.S. PATENT DOCUMENTS

| | | | | |
|---|---|---|---|---|
| 5,723,871 | A * | 3/1998 | Nakanishi et al. | 257/11 |
| 5,834,791 | A * | 11/1998 | Nakanishi et al. | 257/11 |
| 5,838,607 | A * | 11/1998 | Zhu et al. | 365/158 |
| 6,331,994 | B1 * | 12/2001 | Ohmi et al. | 372/82 |
| 6,603,786 | B1 * | 8/2003 | Ohmi et al. | 372/57 |
| 6,762,408 | B1 * | 7/2004 | Read | 250/305 |
| 7,126,689 | B2 * | 10/2006 | Nishi | 356/400 |
| 7,655,907 | B2 * | 2/2010 | Tanimoto et al. | 250/310 |
| 7,755,069 | B2 * | 7/2010 | Zolotorev | 250/493.1 |
| 2007/0139771 | A1 * | 6/2007 | Wang et al. | 359/494 |
| 2007/0165308 | A1 * | 7/2007 | Wang et al. | 359/494 |
| 2008/0273185 | A1 * | 11/2008 | Omura et al. | 355/67 |

OTHER PUBLICATIONS

Bixer et al., "Improved low-energy, electron-spin-polarized 4He+ ion source", Review of Scientific Instruments, Jan. 1999, vol. 70, No. 1, pp. 240-241.

Translation of PCT/ISA/237 of PCT/JP2007/073121 with IB338 and IB373.

L. D. Schearer, "Ion Polarization via Penning Collisions with Optically Pumped Metastable Helium", Physical Review Letters, vol. 22, No. 13, Mar. 31, 1969, pp. 629-631.

Essabaa et al., "Study of the metastable helium spin polarization in an optically pumped afterglow", Nuclear Instruments and Methods in Physics Research, A334, 1994, pp. 315-318.

Schearer et al., "Enhanced polarization of electron spins in 4He by simultaneous optical pumping with circularly and linearly polarized resonance radiation" Physical Review A, vol. 42, No. 7, Oct. 1, 1990, pp. 4028-4031.

Shull et al., "Neutron Scattering and Polarization by Ferromagnetic Materials", Physical Review, vol. 84, No. 5, Dec. 1, 1951, pp. 912-921.

Imada et al., "Nan X sen Ho-shako wo mochiita jiki nishokusei bunko", Nihon Butsurigaku Kaishi (Membership Journal of the Physical Society of Japan), vol. 55, No. 1, 2000, pp. 20-27. Mentioned on p. 4 of the as-filed translation of the specification as concise explanation of relevance.

Johnson et al., "Potassium adsorption and an unoccupied surface state on Fe(001)", Journal of Physics, Condensed Matter, 10, 1998, pp. 95-100.

Onellion et al., "Spin-Polarized Metastable-Atom Deexcitation Spectroscopy: A New Probe of Surface Magnetism", Physical Review Letters, vol. 52, No. 5, Jan. 30, 1984, pp. 380-383.

D.P. Smith, "Scattering of Low-Energy Noble gas Ions from Metal Surfaces", Jounal of Applied Physics, vol. 38, No. 1, Jan. 1967, pp. 340-347.

Happer, "Optical Pumping", Review of Modern Physics, vol. 44, No. 2, Apr. 1972, pp. 169-250.

Aono et al., "Quantitative Surface Atomic Structure Analysis by Low-Energy Ion Scattering Spectroscopy (ISS)", Japanese Jounal of Applied Physics, vol. 24, No. 10, Oct. 1985, pp. 1249-1262.

Taku Suzuki et al., "Development of electron-spin-polarized 4He+(Is) ion source", Extended Abstracts of the 53rd Spring Meeting, The Japan Society of Applied Physics and Related Societies, Tokyo, No. 2, 2006, p. 782. Mentioned on p. 4 of the as-filed translation of the specification as concise explanation of relevance.

Souda et al., "Shadowing and focusing effects in the angular distributions of low-energy rare-gas ions scattered from solid surfaces", Surface Science, 179, 1987, pp. 199-208.

\* cited by examiner

FIG.5
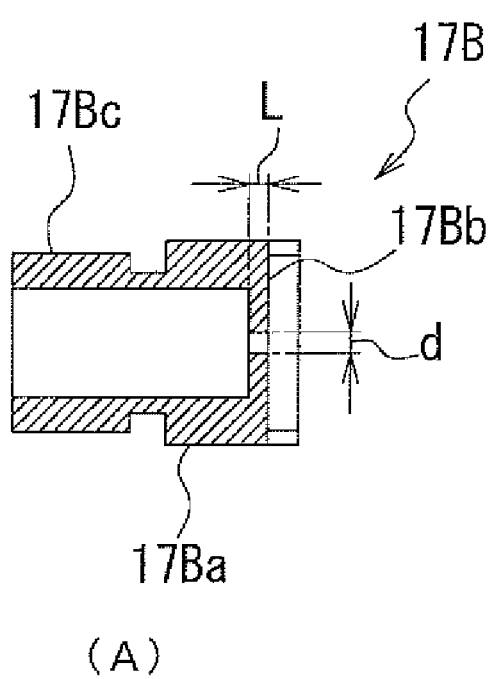
(A)
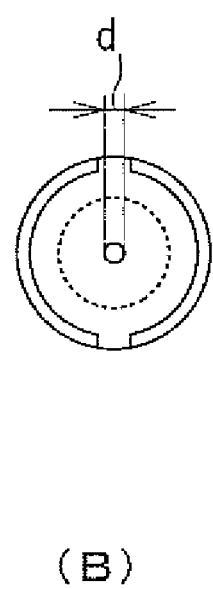
(B)

FIG.12
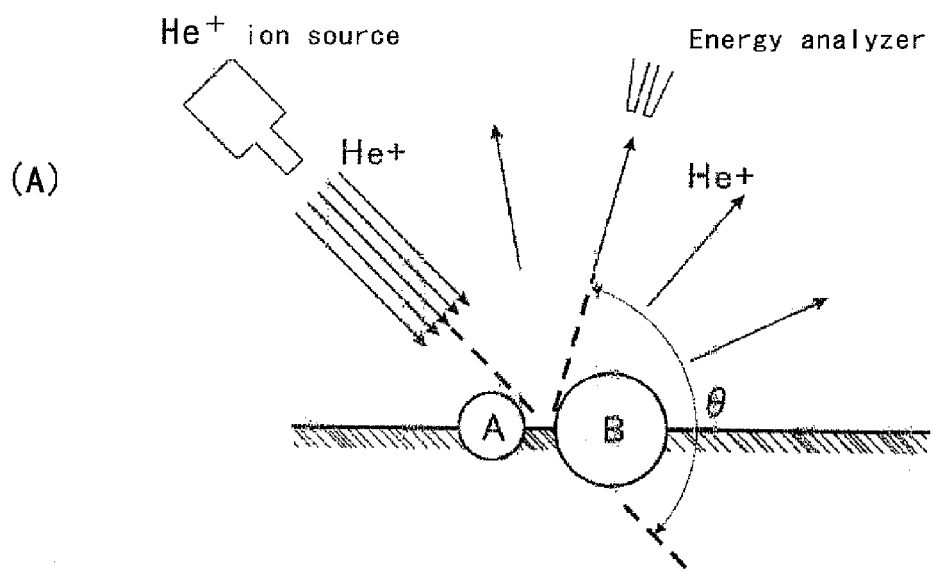
(A)
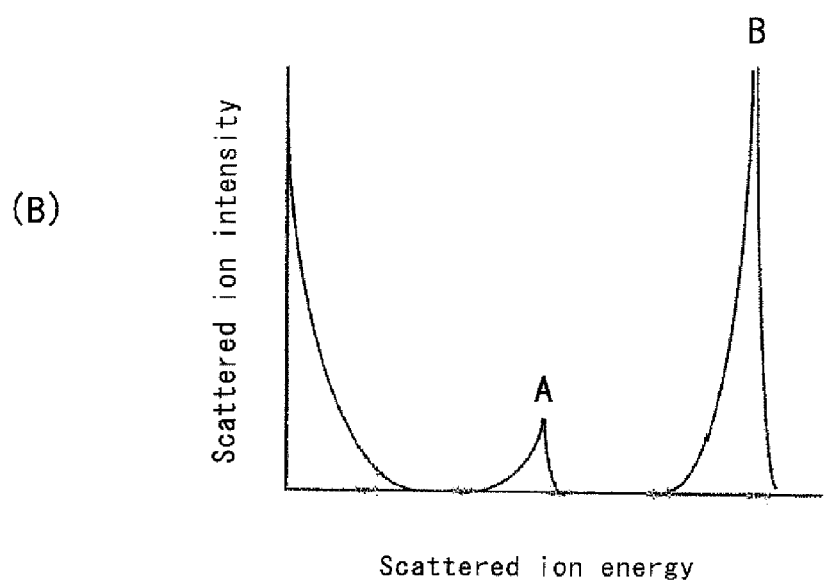
(B)

FIG.13
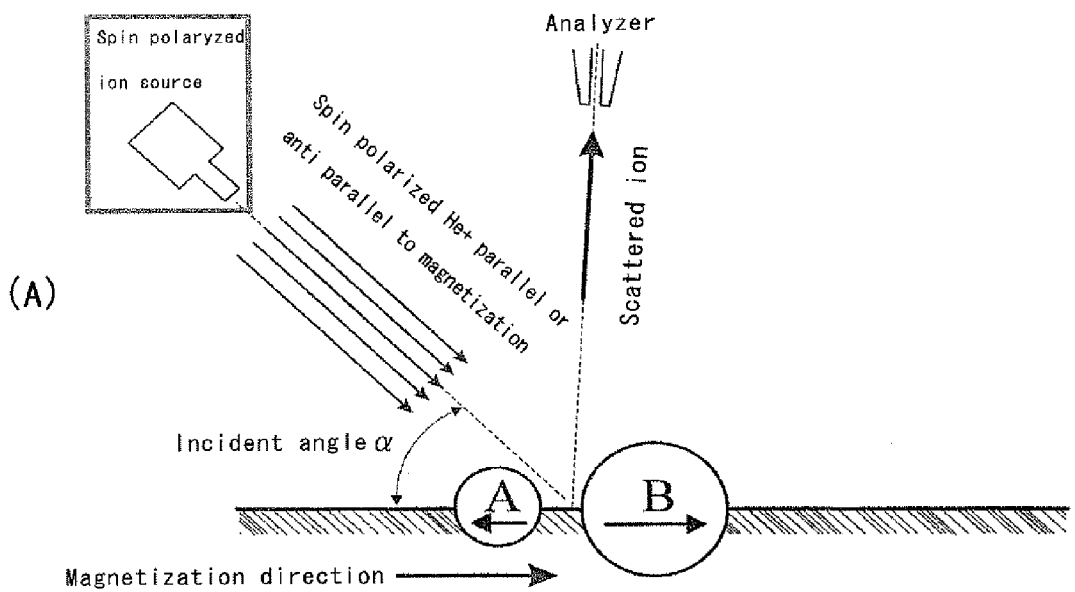
(A)
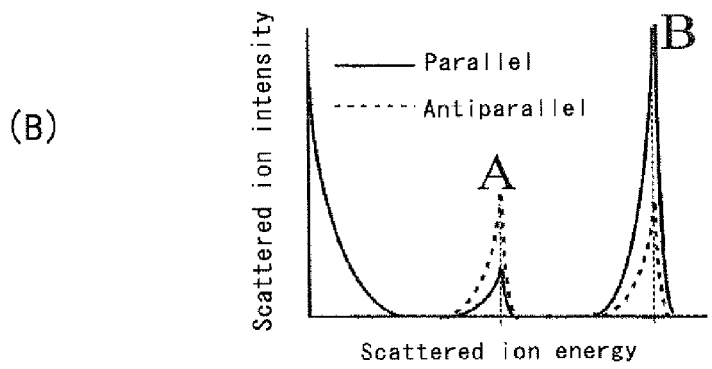
(B)
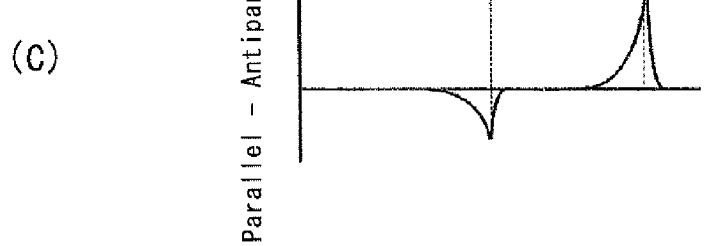
(C)

US 8,017,920 B2

SPIN POLARIZED ION BEAM GENERATION APPARATUS AND SCATTERING SPECTROSCOPY APPARATUS USING THE SPIN POLARIZED ION BEAM AND SPECIMEN PROCESSING APPARATUS

TECHNICAL FIELD

The present invention relates to a spin polarized ion beam generation apparatus, a scattering spectroscopy apparatus through which spin polarized ion beam generated by this generation apparatus is emitted to a specimen and an ion scattered from the specimen is subjected to spectroscopy to investigate the magnetic characteristics of the surface and interface of the material, and an apparatus that uses the spin polarized ion beam to subject the specimen to a reforming processing for example.

The following terms are herein used as having the following meanings.

Polarization Rate:

When assuming that the numbers of ions having an upward spin and a downward spin are $n\uparrow$ and $n\downarrow$ respectively, a polarization rate is defined by $(n\uparrow - n\downarrow)/(n\uparrow + n\downarrow)$. Herein, the polarization rate is multiplied with 100 and the resultant rate is expressed by percentage. When a type of ion is specified, $n\uparrow$ is shown as $N_{M\uparrow}$, wherein M is ion name. For example, the number of polarized monovalent helium cations having an upward spin is shown as $N_{He+\uparrow}$. In the present invention, the term "polarization" means polarization by spin (i.e., spin polarization).

Symbols Such as $D_0$ Line, $D_1$ Line, $D_2$ Line, $2^3S_1$:

The energy level of a metastable helium atom $2^3S_1$ related to an optical pumping will be described with reference to FIG. 19. The spin polarization of the metastable helium atom $2^3S_1$ by an optical pumping uses the transition between $2^3S_1$ and $2^3P$. This $2^3P$ level has a fine structure by the spin-orbit interaction. The transition from $2^3S_1$ to them is called the $D_0$ line, $D_1$ line, and $D_2$ line in an order of a higher transition energy. The symbols of the $D_0$ line, $D_1$ line, and $D_2$ line used herein mean, unless otherwise specified, the transition of the metastable helium atom $2^3S_1$ to $2^3P$.

TECHNICAL BACKGROUND

Non Patent Document 1 reported that the spin polarized helium ion is generated by Penning ionization of optical pumped metastable helium atom ($He^*(2^3S^1)$).

The Penning ionization is represented by the following reaction formula (1),

$$He^* + He^* \rightarrow He^+ + He + e^- \quad (1)$$

where He* represents a metastable helium atom, He⁺ represents a monovalent helium cation, and e⁻ represents an electron. In this reaction, a spin angular momentum component of helium is conserved.

Thus, when metastable helium atom (He*) is subjected to an optical pumping and is spin polarized, then an electron of the generated helium ion (He⁺) is also spin polarized. In the present invention, such an ion is called a polarized ion or a spin polarized ion.

In the case of a method of using the polarized ion beam to inspect the magnetic property of the surface and interface of material, the measurement time must be minimized in order to prevent the surface contamination during the measurement because the polarized ion beam is very sensitive to the surface.

Conventionally, as disclosed in Non Patent Document 2, the polarization of a helium ion has been provided by an optical pumping using circularly polarized light having a wavelength of the $D_1$ line corresponding to the transition of metastable helium atom $2^3S_1$ to $2^3P_1$. Techniques for using circularly polarized light and linearly polarized pumping light that are orthogonal to each other to generate a spin polarized electron out of a metastable helium atom are disclosed in Non Patent Documents 3 and 4.

This conventional technique provides a polarization rate of a helium ion of 18%. A polarized helium ion having a polarization rate equal to or higher than 18% has been impossible. Thus, it was difficult to prevent the surface contamination during the measurement, and there has been the limitation on the measurement result.

In a processing such as a surface reforming by using polarized ion beam, there has caused a limitation of processing accuracy due to the low polarization rate of the polarized ion beam.

The analysis for the identification of elements of the magnetic structure is possible by using the conventional techniques such as neutron scattering (Non Patent Document 5) and magnetic circular dichroism spectroscopy (Non Patent Document 6). However, these techniques are not sensitive to the surface of analyzed specimen, it was impossible to analyze the magnetic structure limited to a few atomic layers of the surface.

On the other hand, the conventional techniques such as the spin polarized photoelectron spectroscopy (Non Patent Document 7) and the spin polarized metastable atom deexcitation spectroscopy (Non Patent Document 8) have the sensitivity to the surface. Since these techniques have no capability to identify elements, it is impossible to analyze the magnetic structure by discriminating an element from an atomic layer.

As described above, the conventional techniques could not provide an analysis of the magnetic structure by discriminating the elements in a few atomic layers of the surface.

Furthermore, it was possible to analyze the composition and structure of the surface and interface by the conventional ion scattering spectroscopy (Non Patent Document 9). However, an analysis of the spin in the surface and interface of a specimen could not be achieved.

In other words, while the elucidation of the magnetic structure of the surface and interface has been important in the development of new devices, it has been impossible to analyze to select elements from the outermost surface of about 2 to 3 atomic layers by using the conventional analysis techniques.

Non Patent Document 1: L. D. Schearer, Physical Review Letters, 22, (1969), 629.

Non Patent Document 2: D. L. Bixler, Review of Scientific Instruments, 70, (1999), 240.

Non Patent Document 3: S. Essabaa et al., Nuclear Instruments and Methods in Physics Research, A334, (1994), 315-318.

Non Patent Document 4: L. D. Schearer et al., Physical Review A, Vol. 42, No. 7, (1 Oct. 1990), 4028-4031.

Non Patent Document 5: C. G. Shull et al., Physical Review, 84, (1951), 912.

Non Patent Document 6: Makoto Imada, Butsuri (Membership Journal of the Physical Society of Japan), 55, (2000), 20.

Non Patent Document 7: P. D. Johnson et al., Journal of Physics, Condensed Matter, 10, (1998), 95.

Non Patent Document 8: M. Onellion et al., Physical Review Letters, 52, (1984), 380.

Non Patent Document 9: D. P. Smith, Journal of Applied Physics, 38, (1967), 340.

Non Patent Document 10: W. Happer, Review of Modern Physics, 44, (1972), 169.

Non Patent Document 11: M. Aono and R. Souda, Japanese Journal of Applied Physics, 24, (1985), 1249.

Non Patent Document 12: Taku Suzuki, Extended Abstracts of the 53rd Spring Meeting, The Japan Society of Applied Physics and Related Societies, Tokyo, No. 2, (2006), 782.

Non Patent Document 13: R. Souda et al., Surface Science, 179, (1987), 199.

DISCLOSURE OF THE INVENTION

Problems to be Solved by the Invention

Accordingly, a first object of the present invention is directed to a spin polarized ion beam generation apparatus substantially obviate the problems due to limitations and disadvantages of the related art mentioned above. The spin polarized ion beam generation apparatus of the present invention has a high polarization rate exceeding 18% so that the measurement time can be reduced to provide accurate measurement and processing impossible by the conventional techniques.

A second object of the present invention is to provide a spin polarized ion scattering spectroscopy apparatus that can serve the analysis of the magnetic structure of a layer close to the outermost surface, e.g., 2 to 3 atomic layers, in the outermost surface by discriminating elements from the atomic layers.

A third object of the present invention is to provide a specimen processing apparatus using a spin polarized ion beam that can emit spin polarized ion to a specimen to process the specimen.

Means for Solving Problem

In order to achieve the first object, the present invention provides a spin polarized ion beam generation apparatus comprising: a high frequency discharge tube for ion generation; a laser oscillator; and a pumping light generator that divides a laser light from said laser oscillator to two lights of a circularly polarized first pumping light and a linearly polarized second pumping light to emit these lights to said high frequency discharge tube with an irradiation angle difference of 90 degrees therebetween, wherein an extraction electrode for extracting a polarized ion is provided to said high frequency discharge tube.

In the above configuration, the polarized ion beam is preferably extracted in a direction orthogonal to both of the circularly polarized light and the linearly polarized light. The high frequency discharge tube preferably includes a repeller electrode opposed to the extraction electrode. The extraction electrode preferably includes a fine pore or aperture so as to reduce the evacuation conductance. The pumping light generator preferably includes a circularly polarized light controller that controls the circularly polarized first pumping light in a clockwise or a counterclockwise direction. The laser oscillator preferably outputs a laser light with a wavelength adjusted so that a polarization rate of a metastable atom as a base of an ion is maximum, the polarization rate being calculated by a measurement of absorption of probe laser. Preferably, the ion is a helium ion, the first and second pumping lights have a wavelength of a $D_0$ line, and the probe light has a wavelength of a $D_0$ line. The high frequency discharge tube preferably has therein a helium pressure of 15 Pa or more and 50 Pa or less.

In order to achieve the second object, the present invention provides a spin polarized ion scattering spectroscopy apparatus including: a spin polarized ion beam generator; a spin polarized ion beam line that irradiates a spin polarized ion beam generated from the spin polarized ion beam generator to a specimen; and a measurement section that measures energy of ions scattered by interaction of the specimen with the spin polarized ion beam, wherein the spin polarized ion beam generator including: a high frequency discharge tube for ion generation; a laser oscillator; and a pumping light generator that divides a laser light from the laser oscillator to two lights of a circularly polarized first pumping light and a linearly polarized second pumping light to emit these lights to the high frequency discharge tube with an irradiation angle difference of 90 degrees therebetween, wherein an extraction electrode for extracting the polarized ion is provided to the high frequency discharge tube.

In the above configuration, the polarized ion beam is preferably extracted in a direction orthogonal to both of the circularly polarized light and the linearly polarized light. The high frequency discharge tube preferably includes a repeller electrode opposed to the extraction electrode. The extraction electrode preferably includes a fine pore like structure. The pumping light generator includes a circularly polarized light controller that controls a circularly polarized light of the first pumping light in a clockwise or a counterclockwise direction. The laser oscillator preferably outputs laser light with a wavelength adjusted so that a polarization rate of a metastable atom as a base of an ion is maximum, the polarization rate being calculated by a measurement of absorption of probe laser. The spin polarized ion scattering spectroscopy apparatus preferably includes a specimen stage that can control an incident angle to a spin polarized ion entering the specimen. Preferably, the ion is a helium ion, the first and second pumping lights have a wavelength of a $D_0$ line, and the probe light has a wavelength of a $D_0$ line.

In another aspect, the present invention provides a spin polarized ion scattering spectroscopy using the spin polarized ion scattering spectroscopy apparatus as mentioned above including: a step of causing spin polarized ion to enter a specimen; a step of measuring scattered ions from the specimen; and a step of measuring scattered ion intensities with regard to respective spins of incident ion species to analyze a magnetic structure of a surface of the specimen based on a dependency of the specimen on a spin of a probability at which an ion enters the specimen is neutralized.

In the above configuration, the spin polarized ion scattering spectroscopy preferably includes: a step of detecting the scattered ion intensity by an electrostatic analyzer to analyze a magnetic structure of a surface of a specimen based on a difference in the scattered ion intensity depending on a direction of a spin of an ion. The spin polarized ion scattering spectroscopy preferably includes: a step of measuring a dependency of the scattered ion intensity on an incident angle of the spin polarized ion to the specimen; and a step of analyzing a spin while discriminating, based on the measurement of the scattered ion intensity, an atomic layer from an element in a direction of the depth from a surface of the specimen. The spin polarized ion scattering spectroscopy preferably includes: a step of analyzing a magnetic structure of a surface of said specimen based on a detected amount by an electrostatic analyzer before and after changing a direction of a spin of the spin polarized ion.

In order to achieve the third object, the present invention provides a specimen processing apparatus using spin polarized ion beam including: a spin polarized ion beam generator; a spin polarized ion beam line that irradiates a spin polarized ion beam generated from said spin polarized ion beam generator to a specimen; and an ultrahigh vacuum chamber that is irradiated a shaped spin polarized ion beam from said spin polarized ion beam line to said specimen thereof, wherein said spin polarized ion beam generator including: a high frequency discharge tube for ion generation; a laser oscillator; and a pumping light generator that divides a laser light from said laser oscillator to two lights of a circularly polarized first pumping light and a linearly polarized second pumping light to emit these lights to said high frequency discharge tube with an irradiation angle difference of 90 degrees therebetween, wherein an extraction electrode for extracting said polarized ion is provided to said high frequency discharge tube.

In the above configuration, the polarized ion beam is preferably extracted in a direction orthogonal to both of the circularly polarized light and the linearly polarized light. The high frequency discharge tube preferably includes a repeller electrode opposed to the extraction electrode. The extraction electrode preferably includes a fine pore. The pumping light generator includes a circularly polarized light controller that controls a circularly polarized light of the first pumping light in a clockwise or a counterclockwise direction. The pumping light generator preferably includes a circularly polarized light controller that controls the first pumping light of the circularly polarized light in a clockwise or a counter clockwise direction. The laser oscillator preferably outputs laser light with a wavelength adjusted so that a polarization rate of a metastable atom as a base of an ion is maximum, the polarization rate being calculated by a measurement of absorption of probe laser. The specimen processing apparatus preferably includes a specimen stage that can control an incident angle to a spin polarized ion entering the specimen. The spin polarized ion beam line preferably includes a lens having a fine pore functioning as an evacuation hole and the lens is made of non magnetic material. The ion is a helium ion and the first and second pumping lights have a wavelength of a $D_0$ line.

Effect of the Invention

According to the spin polarized ion beam generation apparatus of the present invention, the spin polarized ion beam having a polarization rate 1.5 times or more higher than that of the conventional technique can be achieved. In the measurement with the same accuracy as that used in the conventional technique, the measurement time could be reduced to ⅔ times or shorter than that of the conventional technique.

According to the spin polarized ion scattering spectroscopy apparatus of the present invention, the surface spin analysis can be carried out so that elements and atomic layers can be discriminated at a depth of 2 to 3 atomic layers from the outermost surface of the specimen. Thus, the analysis of the magnetic structure can be achieved at a region at a depth of about 2 to 3 atomic layers from the outermost surface.

Furthermore, according to the spin polarized ion scattering spectroscopy apparatus of the present invention, the spin polarized ion is caused to enter the surface of the specimen. The energy analysis of the scattered ion can be measured with regard to the respective spins of the incident ion (i.e., spin polarization measurement) to measure the spin dependence of a probability at which an ion entering the surface of specimen is neutralized.

According to the specimen processing apparatus using spin polarized ion beam of the present invention, the outermost surface of the specimen can be processed by spin polarized ion beam. Even when the same processing method as in the conventional technique is used, this specimen processing apparatus can realize such a processing accuracy based on the spin dependence of the interaction between ion and the object to be processed that is 1.5 times or more higher than in the conventional case. The highly polarized ion beam enabled by the present invention can be used for the reforming of a specimen or the control of the spin in a step of manufacturing a device using spin conduction for example, thus providing more sophisticated material.

BRIEF DESCRIPTION OF DRAWINGS

In the drawings:

FIGS. 3A to 3C illustrate an example of the configuration of a high frequency discharge tube, in which FIG. 3A is a front cross sectional view of the high frequency discharge tube, FIG. 3B is a left side view of the high frequency discharge tube and FIG. 3C is a right side view of the high frequency discharge tube;

FIGS. 5A and 5B illustrate an example of an orifice plate of FIG. 4, in which FIG. 5A is a front cross sectional view of the orifice plate and FIG. 5B is a right side view of the orifice plate;

FIGS. 12A and 12B illustrate ion scattering spectroscopy, in which FIG. 12A is a schematic view of the ion scattering spectroscopy and FIG. 12B illustrates a spectroscopy spectrum obtained by the ion scattering spectroscopy;

FIGS. 13A, 13B, and 13C illustrate the spin polarized ion scattering spectroscopy, in which FIG. 13A is a schematic view of the spin polarized ion scattering spectroscopy, FIG. 13B illustrates spectroscopy spectra obtained by the spin polarized ion scattering spectroscopy and FIG. 13C illustrates a difference spectrum of the spectroscopy spectra corresponding to the respective spins obtained in FIG. 13B;

DESCRIPTION OF THE REFERENCE NUMERALS

Figure 1:
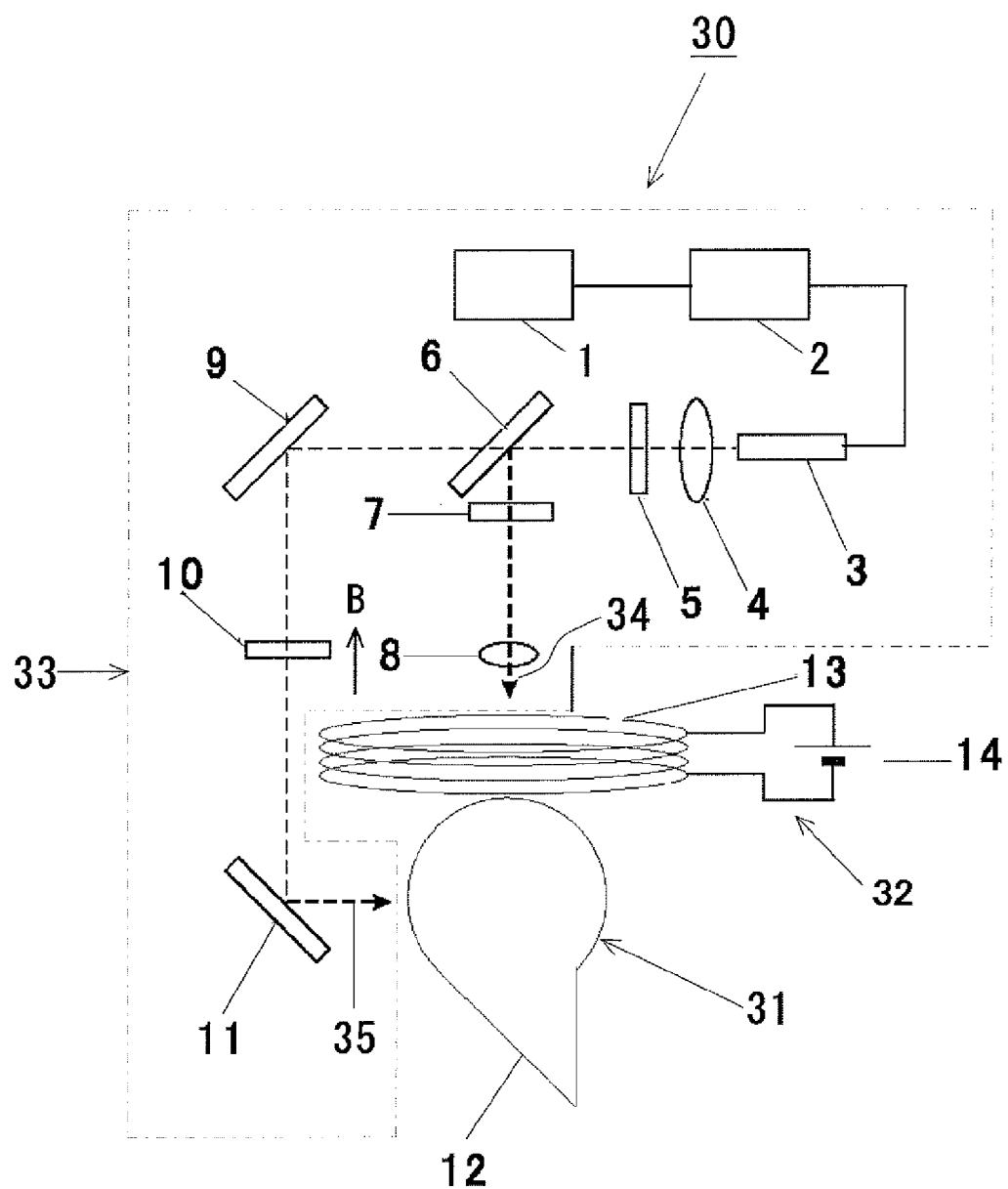
FIG. 1 is a schematic view illustrating the configuration of a spin polarized ion beam generation apparatus according to the first embodiment of the present invention.

1: Laser oscillator
2: Optical fiber amplifier
3: Optical fiber connector
4, 8, 67: Lens
5, 10: Half wavelength plate
6, 56: Half mirror
7, 65: Quarter wavelength plate
9, 9A, 58, 59, 64, 66: Mirror
11: Concave mirror
12, 15: High frequency discharge tube
15A: Main body
15B: Flange
15C: He gas inlet
15D: He gas outlet
15E: Wiring port
15F: Extraction electrode insertion section
13: Coil
14, 87: DC power source
16: High frequency electrode
17: Extraction electrode
17A: Orifice plate retainer
17B: Orifice plate
17Ba: Cylindrical section
17Bb: Orifice plate section
17Bc: Screw section
17C: Cylindrical section
17D: Flange
18: Matching unit
19: High frequency power source
20: Repeller electrode
21: Condenser lens
22: Focusing lens
23, 26: Deflector
24: Einzel lens
25: Decelerator
27, 73: Specimen (O/Fe/MgO magnetic substrate)
28: Spin polarized ion beam
30: Polarized ion beam generation apparatus
31: High frequency discharger
32: Magnetic field applicator
33: Pumping light generator
34: First pumping light (circularly polarized light)
35: Second pumping light (linearly polarized light)
36, 36A: Polarized ion beam shaping section
38: Glan laser prism
39: Flange
41, 81: Electrostatic analyzer
42: Secondary electron multiplier
43: Preamplifier
44: Multichannel scaler
45, 82: Computer
50: Pumping light wavelength adjuster
51: Probe light oscillator
52: Transmitted light measurement section
53: Probe light laser oscillator
53A: Probe light laser oscillator power source
54, 54A, 54B, 54C, 54D, 54E: Probe light
55: Beam splitter
57, 68: Slit
60: Probe helium discharge tube
61: Light detector
62: Lock-in amplifier
63: Attenuator
69: Transmitted light detector
70: Spin polarized ion scattering spectroscopy apparatus
71: Spin polarized ion beam generator
72: Spin polarized ion beam line
74, 103: Ultrahigh vacuum chamber
75: Measurement section
76: Optical pumping irradiation light
77: Helium gas inlet
78: High frequency helium ion source
79, 80: Differential evacuation port
81A: Electrostatic analyzer power source
84: Circularly polarized light controller
84A: Motor
84B: Motor driving section
85: Specimen magnetization section
86: Specimen magnetization coil
88: Capacitor
89: Switch
90: Mount stand
91: Vacuum evacuation section
93, 95, 97: Port
94: Stern Gerlach analyzer
96: RHEED
98: Manipulator
99: Specimen carrying section
100: Specimen processing apparatus using spin polarized ion beam
101: Object to be processed
102: Specimen holding section

THE BEST MODE FOR CARRYING OUT THE INVENTION

First Embodiment

Hereinafter, the present invention will be described in detail with reference to embodiments shown in the drawings.

First, a spin polarized ion beam generation apparatus according to an first embodiment will be described.

FIG. 1 is a schematic view illustrating the configuration of a spin polarized ion beam generation apparatus 30 according to an first embodiment. The spin polarized ion beam generation apparatus 30 is composed of: a high frequency discharger 31 made of a high frequency discharge tube 12 or the like; and a magnetic field applicator 32; and a pumping light generator 33 that generates pumping lights.

Gas consisting of atoms for making polarized ion is introduced into the high frequency discharge tube 12. Application of the high frequency power source 19 or the like forms plasma to ionize atoms in a metastable status. A magnetic field (see ↑B of FIG. 1) is applied to the high frequency discharge tube 12 from the magnetic field applicator 32. Then, a first pumping light 34 and a second pumping light 35 orthogonal to each other are emitted from the pumping light generator 33 to turn ions in the high frequency discharge tube 12 into a polarized ion beam to emit the beam in a direction vertical to the paper (direction Z).

In the present invention, the generated spin polarized ion is not limited to those obtained by the high frequency discharge. The generated spin polarized ion also may be any ion so long as that the polarized ions can be generated by emitting the pumping lights 34 and 35 to ions generated by the discharge.

The pumping light generator 33 is an irradiation apparatus for carrying out the optical pumping to the high frequency discharge tube 12. The pumping light generator 33 is structured to include: a laser oscillator 1 such as an optical fiber laser for performing the optical pumping; an optical fiber amplifier 2; an optical fiber connector 3; a lens 4; a half wavelength plate 5; a half mirror 6; a quarter wavelength plate 7; a lens 8; a mirror 9; a half wavelength plate 10; and a concave mirror 11.

An output light from the optical fiber laser is input to the optical fiber amplifier 2 via the optical fiber. This input light is amplified by the optical fiber amplifier 2 and an amplified light is emitted from the optical fiber connector 3 to a space. A polarizer provided in the optical fiber laser is used to adjust in advance this emitted light to be linearly polarized light. A polarization direction of an emitted light to the space is adjusted by the half wavelength plate 5 and a path of the emitted light having an intensity that is about a half is change by using the half mirror 6. This light having the changed path is converted to a circularly polarized light (also called as sigma (σ) light) as the first pumping light 34 by using the quarter wavelength plate 7. The first pumping light 34 is irradiated to the high frequency discharge tube 12. Thus, the first pumping light 34 is adjusted to be the circularly polarized light by the quarter wavelength plate 7. Further, a direction along which of the circularly polarized first pumping light 34 is adjusted to be parallel to a magnetic field generated by the magnetic field applicator 32. Thus, the pumping light generator 33 can generate the circularly polarized first pumping light 34 and the linearly polarized second pumping light 35 from the laser oscillator 1. Specifically, the pumping light generator 33 serves as a light polarizer that generates the first pumping light 34 and the linearly polarized second pumping light 35.

In order to linearly polarize the light emitted from the optical fiber laser, the light emitted to the space also may be polarized by the half wavelength plate 5 and a glan laser prism (not shown). The glan laser prism is a polarization prism using calcite for example.

The magnetic field applicator 32 can be composed of an electromagnet consisting of a coil 13 and a DC power source 14. The magnetic field made by the coil 13 is adjusted to be about 1 to 3 gauss by the DC power source 14. The magnetic field applied to the high frequency discharge tube 12 must be parallel to the first pumping light 34. The geomagnetic field is about 0.5 gauss. Its direction is generally not parallel to the ground and has a magnetic inclination. Thus, the magnetic field in the high frequency discharge tube 12 can be parallel to the first pumping light 34 by the application of the magnetic field of about 1 to 3 gauss higher than the geomagnetic field. The magnetic field made by the coil 13 exceeding 3 gauss is not preferred because such a high magnetic field has an influence on the orbit of the spin polarized ion. Another method for using a Helmholtz coil for example to cancel the geomagnetic field also may be used so long as the magnetic field in the high frequency discharge tube 12 is parallel to the first pumping light 34.

When the polarized ion beam is made of helium, a wavelength of the first and second pumping lights 34 and 35 can be the $D_0$ line corresponding to the transition of the metastable helium atom $2^3S_1$ to $2^3P_0$. The each line width of the first and the second pumping lights 34 and 35 is 2 GHz or less.

On the other hand, the mirror 9 and the concave mirror 11 are adjusted so that a light passed the half mirror 6 is emitted to high frequency discharge tube 12. The second pumping light 35 of linearly polarized light (also called pie (π) light) is irradiated in a direction adjusted to be vertical to the magnetic field made by the coil 13. Further, a polarization direction is adjusted by the half wavelength plate 10 in order to allow a polarization component of the linearly polarized light to be parallel to the magnetic field made by the coil 13.

The pumping light generator 33 has a function to divide the linearly polarized laser light emitted from the laser oscillator 1 to the circularly polarized light and the linearly polarized light and to emit these lights with an irradiation angle difference of 90 degrees therebetween, i.e. perpendicular alignment, to the high frequency discharge tube 12.

Figure 2:
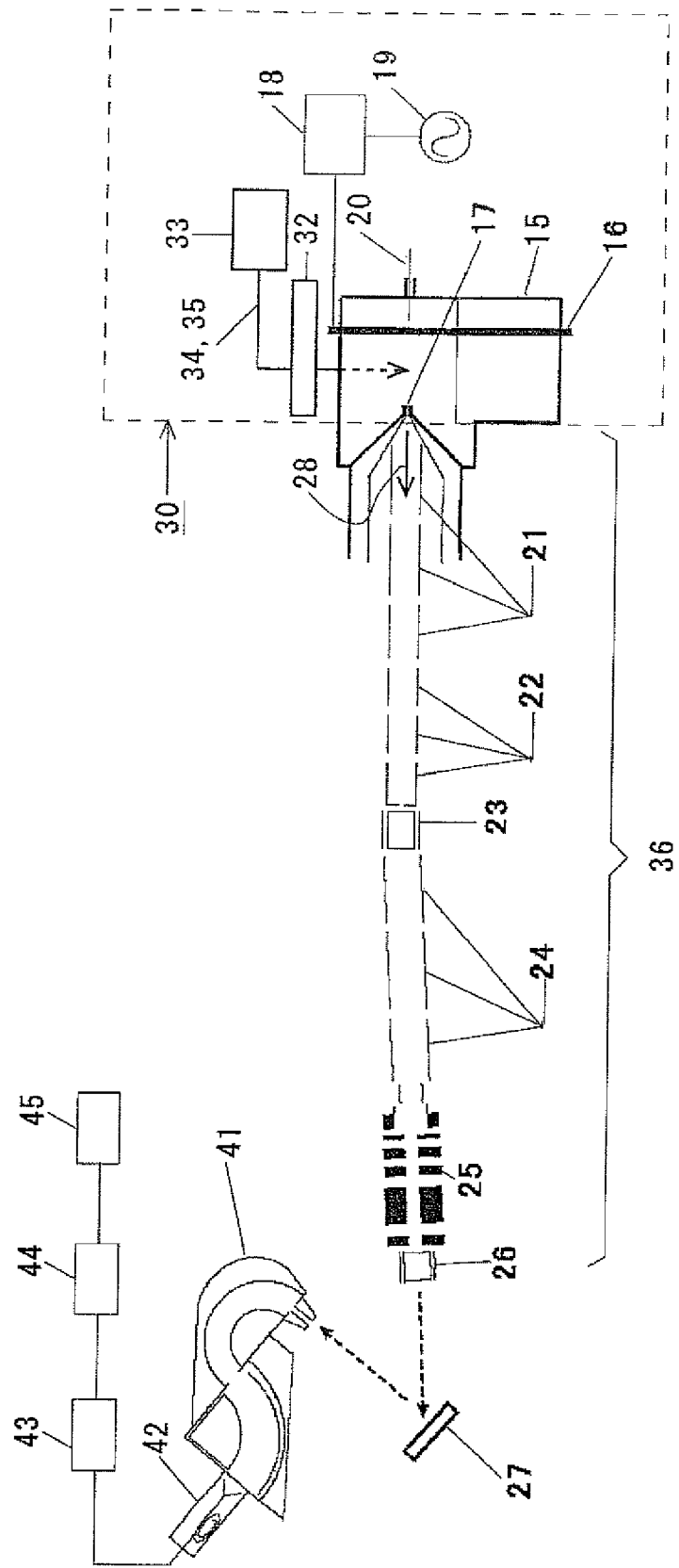
FIG. 2 is a schematic view illustrating a system for evaluating the polarization rate of a polarized ion generated in the spin polarized ion beam generation apparatus of FIG. 1.

FIG. 2 is a schematic view illustrating a system for evaluating the polarization rate of a polarized ion generated in the spin polarized ion beam generation apparatus 30. This system also can be used as the spin polarized ion beam irradiation apparatus 30 that emits a polarized ion to a specimen 27. The spin polarized ion beam generation apparatus 30 of the present invention can emit the spin polarized ion to the specimen 27 to process the specimen 27.

When the plasma is generated by the application of a high frequency power, a matching unit 18 for impedance matching is inserted in order to efficiently realize a power transmission between a high frequency electrode 16 provided in a high frequency discharge tube 15 and the high frequency power source 19. The matching unit 18 can be composed of a transformer, a coil, or a capacitor for example. The high frequency electrode 16 can have an electrode configuration such as so called capacitive coupling and so on. A frequency of the high frequency power source 19 is not limited to a particular value and it may be 13.56 MHz for example.

The spin polarized ion beam 28 generated by the spin polarized ion beam generation apparatus 30 is emitted via a polarized ion beam shaping section 36 to the specimen 27. As shown in the configuration of FIG. 2, the polarized ion beam shaping section 36 is provided with a repeller electrode 20, lenses 21, 22 and 24, deflectors 23 and 26, and a decelerator 25 to transport the polarized ion emitted from an extraction electrode 17 to the specimen 27.

Most part of the polarized ion reaching the specimen 27 is neutralized through the interaction with the specimen 27 to become atoms in a ground state. In this interaction, electrons are emitted from the specimen 27. With regard to the respective directions of spins of the polarized ions, an intensity of these electrons are measured as a function of its kinetic energy with regard to the respective direction of spin of the polarized ions by an electrostatic analyzer 41, an secondary electron multiplier 42, a preamplifier 43, a multichannel scaler 44, and a personal computer 45.

The polarized ion beam shaping section 36, the holding section of the specimen 27, and the electrostatic analyzer 41 are evacuated by a not shown vacuum evacuation apparatus so as to have an ultrahigh vacuum condition of about $10^{-8}$ Pa. The above evaluation system is surrounded by a not shown Helmholtz coil to apply a definite magnetic field of the order of 100 milligauss to the entire system. In the following description, it is assumed that the polarized ion is polarized helium ion made of helium.

A direction of the polarization of helium ion (upward or downward) can be controlled by changing the direction of the quarter wavelength plate 7 as shown in FIG. 1. Since the intensity of emitted electrons by helium ion having upward and downward spin components is proportional to $N_{He+}\uparrow$ and $N_{He+}\downarrow$, respectively, a spin asymmetricity rate is represented by the following formula (2).

$$\text{Spin asymmetricity rate} = (N_{He+}\uparrow - N_{He+}\downarrow)/\{(N_{He+}\uparrow + N_{He+}\downarrow) \times P\} \quad (2)$$

where P is a polarization rate of spin polarized helium ion entering thereto.

Thus, the following formula is determined based on the formula (2).

$$P = (N_{He+}\uparrow - N_{He+}\downarrow)/\{(N_{He+}\uparrow + N_{He+}\downarrow) \times \text{spin asymmetricity rate}\}$$

Since the measurement is carried out with regard to the same specimen 27, a relative change in P can be calculated with the assumption that the spin asymmetricity rate is a constant. In other words, the measurement amount is $(N_{He+}\uparrow - N_{He+}\downarrow)/(N_{He+}\uparrow + N_{He+}\downarrow)$ which is equal to the P×(spin asymmetricity rate) and thus is proportional to the polarization rate of polarized helium ion. Thus, the change in the polarization rate of polarized helium ion is obtained by measuring $(N_{He+}\uparrow - N_{Hc+}\downarrow)/(N_{Hc+}\uparrow + N_{Hc+}\downarrow)$ which is given by the apparatus as shown in FIG. 2. As described above, this method evaluates the helium ion polarization rate based on the measurement of the spin asymmetricity rate. The specimen 27 is desirably made of magnetic material.

As shown in FIG. 2, the high frequency discharge tube 15 further includes the extraction electrode 17 and the repeller electrode 20. The outer periphery of the high frequency discharge tube 15 has the high frequency electrode 16. The high frequency electrode 16 is connected to the high frequency power source 19 via the matching unit 18. By this configuration, the high frequency discharge tube 15 generates helium plasma. Next, the optical pumping by the pumping light generator 33 shown in FIG. 1 serves the metastable helium atom $2^3 S_1$ in this plasma to spin polarization. This polarized helium ion can be generated by a Penning ionization reaction of this polarized metastable helium atom (He*). In the following description, when the high frequency discharge tubes 12 and 15 are a helium discharge tube, the high frequency discharge tubes 12 and 15 are called a high frequency helium discharge tube conveniently.

In the case of a polarization electron source for generating polarized electrons out of helium, the Penning ionization of He* and $CO_2$ gas is used. However, the Penning ionization cross section obtained through the Penning ionization of He* and He* is smaller than the cross section obtained through the Penning ionization of He* and $CO_2$ gas. In order to generate the Penning ionization of He* and He*, a sufficient amount of He* must be generated. Thus, a higher amount of He gas must be introduced to the high frequency discharge tube 15 when compared with a case of a polarization electron source. As will be described later, a pressure of about 10 Pa or more is required in order to generate polarized helium ion having a high polarization rate.

Figure 3:
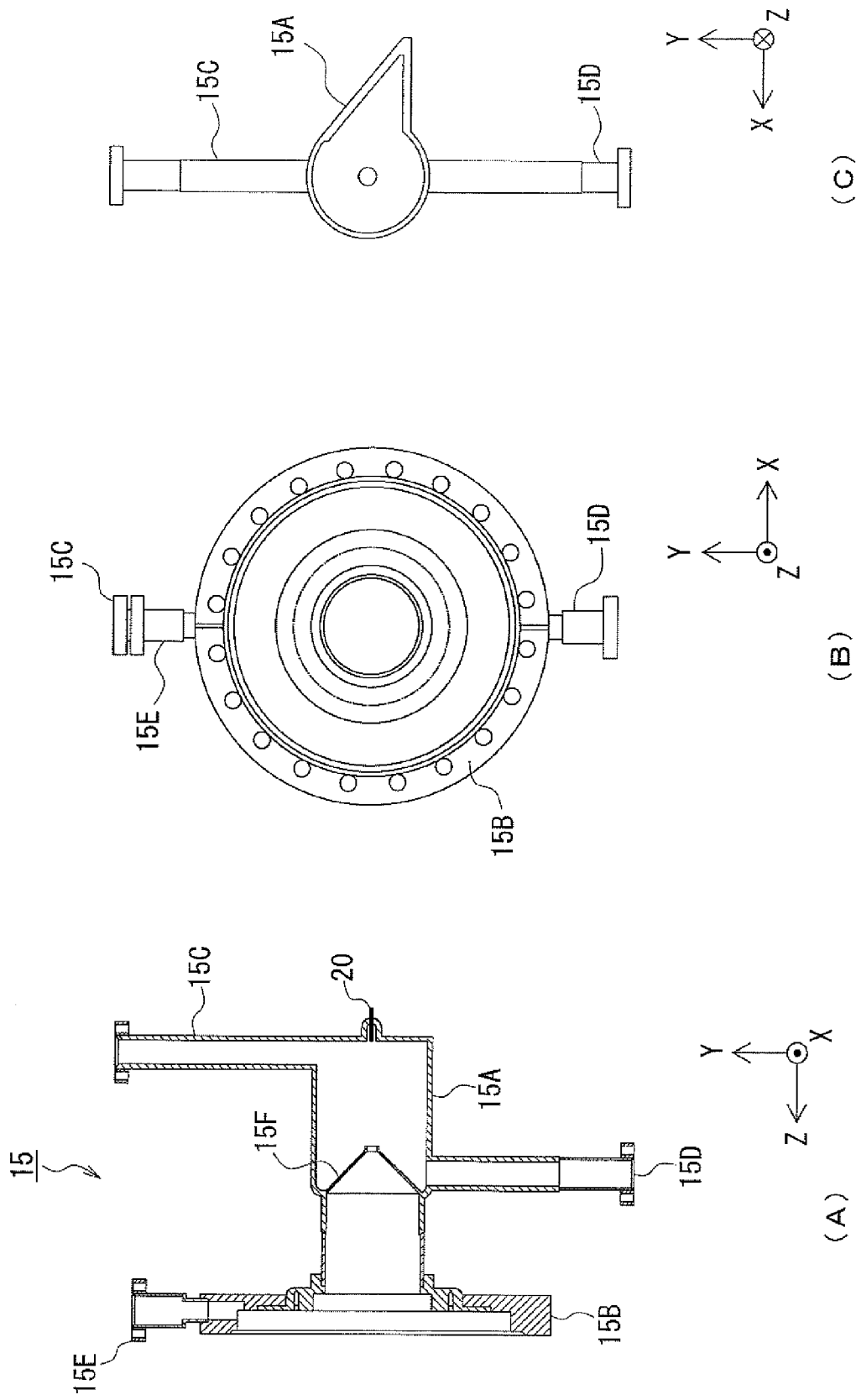

FIGS. 3A to 3C illustrate an example of the configuration of a high frequency discharge tube 15. FIG. 3A is a front cross sectional view of the high frequency discharge tube 15. FIG. 3B is a left side view of the high frequency discharge tube 15. FIG. 3C is a right side view of the high frequency discharge tube 15.

As shown in FIG. 3A, the high frequency discharge tube 15 is composed of a main body 15A and a flange 15B. The main body 15A is made of glass or the like. The main body 15A is composed of: the extraction electrode 17 provided at a left end in the direction Z; the repeller electrode 20 provided at a right end in the direction Z; a He gas inlet 15C provided from the right end in the direction Z to the upper side in the vertical direction (direction Y); a He gas outlet 15D provided from the left end in the direction Z to the lower side in the vertical direction (direction -Y); a wiring port 15E; and an extraction electrode insertion section 15F.

As shown in FIG. 3C, the cross sectional shape of the main body 15A in the plane XY is composed of a circular arc and two straight lines having ends connected to both ends of this circular arc. The other ends of the two straight lines are connected to form a predetermined angle. Generally, the polarization of reflected light entered to media having different refractive indices is different from the polarization of the incident light. Specifically, even when the first pumping light (σ light) 34 is the perfect circularly polarized light, the reflected light from the bottom face of the high frequency discharge tube 15 is not a perfect circularly polarized light. As described above, a reduction of degree of circularly polarization of light consequently causes a reduced polarization rate of polarized ion beam. In order to prevent this, the structure of the cross sectional shape of the main body 15A is constructed so that the first pumping light (σ light) 34 reflected from the bottom face of the high frequency discharge tube 15 is prevented from entering plasma again. In this structure, the cross section of the high frequency discharge tube 15 is composed of a circular arc and two straight lines having ends connected to both ends of this circular arc. However, this invention is not limited to this structure. Any structure may be used so long as the first pumping light (σ light) 34 is prevented from losing the polarization degree.

The extraction electrode 17 is an electrode having a substantially circular conical shape as described later. The bottom face side is opposed to the flange 15B as shown in FIG. 3C. The opening of the vertex side of the circular conical shape has an electrode 17 including a fine pore or aperture.

The repeller electrode 20 is an electrode made of a metal wire that is provided along the center axis of the high frequency helium discharge tube 15 in the direction Z and is made of a W (tungsten) wire for example.

As shown in FIG. 3C, the flange 15B is connected to the polarized ion beam shaping section 36. The upper side from the upper end of flange in the vertical direction is connected to a port 15E through which a wiring for giving a potential to the extraction electrode 17 is introduced to vacuum atmosphere.

Figure 4:
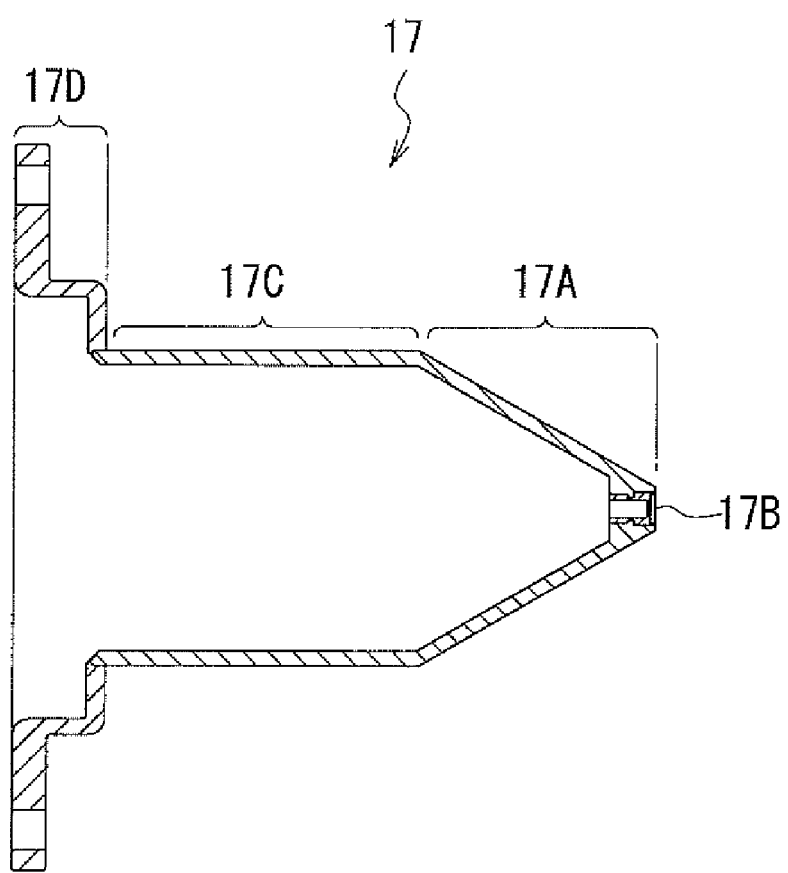
FIG. 4 is an enlarged cross sectional view illustrating an example of an extraction electrode.

FIG. 4 is an enlarged cross sectional view illustrating an example of the extraction electrode 17. The extraction electrode 17 is inserted to the extraction electrode insertion section 15F of the high frequency discharge tube 15. The extraction electrode 17 is composed of: a circular conical shaped orifice plate retainer 17A; an orifice plate 17B inserted to the opening at the vertex of the orifice plate retainer 17A; a cylindrical section 17C connected to a left end of the orifice plate retainer 17A; and a flange 17D connected to the left end of the cylindrical section 17C. The orifice plate retainer 17A, the cylindrical section 17C and the flange 17D are made of metal such as stainless. The orifice plate retainer 17A and the orifice plate 17B are connected to each other in an integrated manner by welding or a screw to prevent electrical resistance. In the shown case, the orifice plate 17B is screwed with the orifice plate retainer 17A by screws provided at the inner face of the axis side of the opening of the orifice plate retainer 17A and a predetermined position of the outer periphery of the orifice plate 17B. The flange 17D is connected to the flange 15B of the high frequency discharge tube 15. The extraction electrode insertion section 15F is structured so that a part corresponding to the tip end of the extraction electrode 17 is opened. By the extraction electrode 17 having a circular cone like shape as shown in FIG. 4, the first and second pumping lights 34 and 35 can be efficiently irradiated to metastable helium atoms in the vicinity of plasma sheath.

For example, the respective electrode voltages may be provided so that the voltage of the repeller electrode 20 is 1.44 keV and the voltage of the extraction electrode 17 is 1.2 keV. Then, He$^+$ ion beam having a kinetic energy of about 1.4 keV is generated. These electrode voltages also may be appropriately changed to provide a predetermined ion kinetic energy other than this kinetic energy.

FIGS. 5A and 5B illustrate an example of the orifice plate 17B of FIG. 4. FIG. 5A is a front cross sectional view of the orifice plate 17B. FIG. 5B is a right side view of the orifice plate 17B.

The orifice plate 17B is composed of: a cylindrical section 17Ba; and an orifice plate 17Bb provided at the right end of the cylindrical section 17C. A predetermined position at the left side of the cylindrical section 17Ba has a screw section 17Bc. The center of the orifice plate 17Bb has a fine pore or aperture like structure (orifice) having a diameter d and a length L. The fine pore is opposed to the main body 15A of a high frequency discharge tube. The orifice plate 17B is made of molybdenum for example. The fine pore is sized to have a diameter of 0.5 mm and the length L on the center axis of 0.8 mm for example. The fine pore preferably has a diameter of 0.3 to 1 mm. The fine pore having a diameter of 0.3 mm or less causes a reduced amount of extraction of generated polarized ion. The fine pore having a diameter of 1 mm or more is not preferred because a great amount of helium gas in the high frequency discharge tube 15 flows into the polarized ion beam shaping section 36. Due to the same reason, the fine pore preferably has a length of 0.3 to 2 mm.

According to the high frequency discharge tube 15 of the configuration, even when the pressure of helium gas in the high frequency discharge tube 15 increases, the existence of the fine pore provided in the extraction electrode 17 can reduce the conductance from the high frequency discharge tube 15 to a beam line. Thus, helium gas can be effectively suppressed from being flowed into the polarized ion beam shaping section 36.

On the other hand, by applying a positive voltage to the repeller electrode 20 (e.g., by applying a voltage of about 50V to 300V to the extraction electrode 17), polarized helium ion can be effectively transported to the polarized ion beam shaping section 36. Thus, an increased amount of polarized helium ion can be extracted to the polarized ion beam shaping section 36.

The polarized ion beam current reaching the specimen 27 significantly depends on the degree of vacuum atmosphere in the polarized ion beam shaping section 36. Gas remaining in the polarized ion beam shaping section 36 is mainly composed of helium gas flowed from the polarized ion beam generation apparatus 30. The structure of the polarized ion beam shaping section 36 for preventing this inflow of helium gas will be explained.

Figure 6:
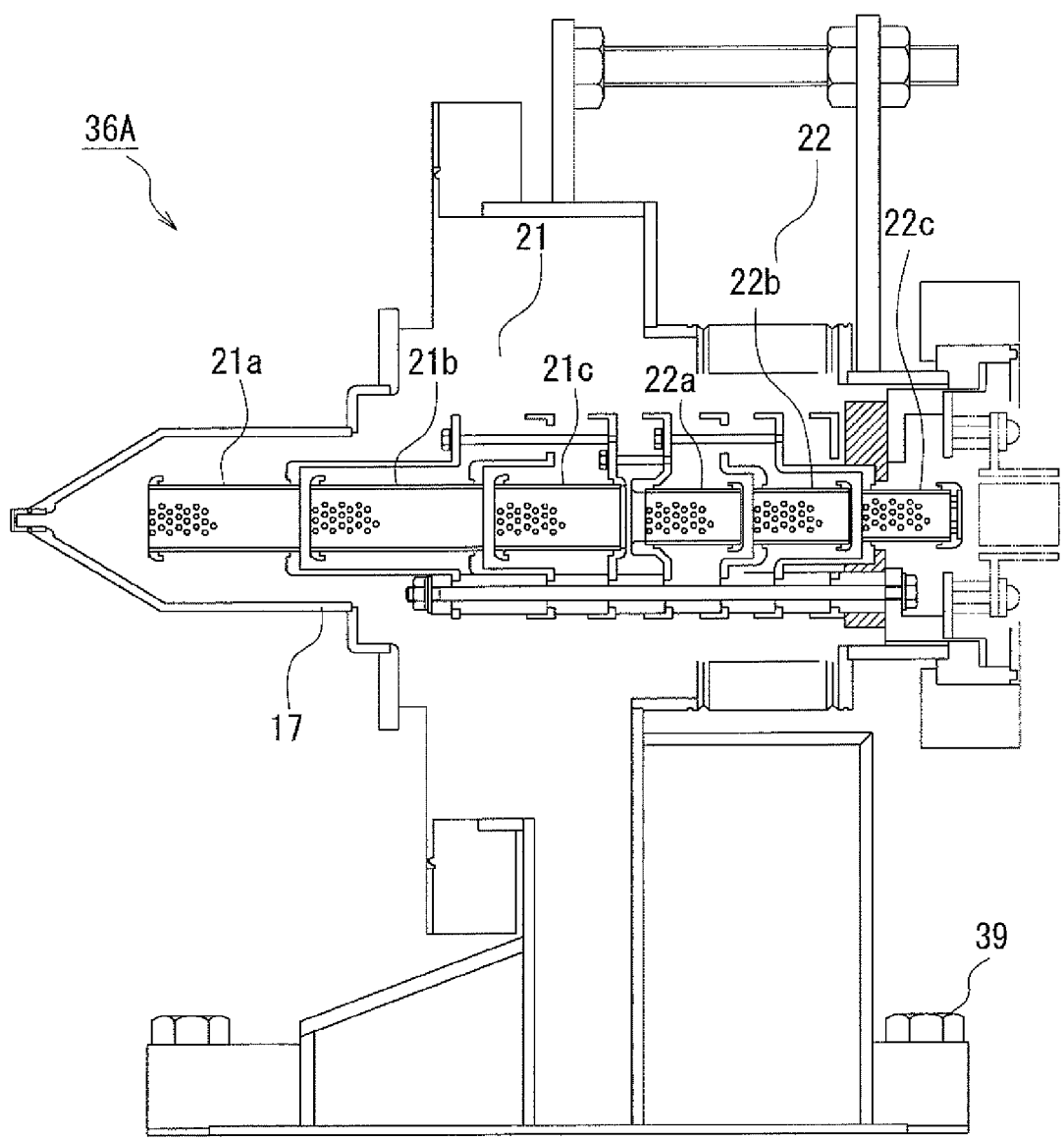
FIG. 6 is a cross sectional view schematically illustrating a part of the configuration of a polarized ion beam shaping section.

FIG. 6 is a cross sectional view schematically illustrating a configuration of a part 36A of the polarized ion beam shaping section. In the polarized ion beam shaping section 36A as shown in FIG. 6, the left side in the horizontal direction of the paper shows an incoming side of polarized ion connected to the spin polarized ion beam generation apparatus 30 and the right side in the horizontal direction of the paper shows a side from which polarized ion is emitted. In the shown case, from the incoming side, condenser lenses 21a, 21b and 21c as well as focusing lenses 22a, 22b and 22c are arranged in this order. The respective lenses 21 and 22 are provided in a vacuum chamber and a region including therein the lenses 21 and 22 are evacuated. A flange 39 is connected to a not shown vacuum pump 39A. Evacuation is provided by the vacuum pump 39A.

In order to effectively evacuate helium gas flowing from the polarized ion beam generation apparatus 30, all of the lenses 21 and 22 have a plurality of fine pores at the outer periphery thereof. The respective fine pores have a diameter of about 1 mm. A not shown einzel lens 24 (see FIG. 2) in the polarized ion beam shaping section 36A also has fine pores as in the condenser lens 21 and the focusing lens 22. The condenser lens 21 and the focusing lens 22 are electrostatic lenses. In order to prevent the depolarization of polarized ion beam, all of the condenser lens 21, the focusing lens 22, a not shown einzel lens 24, and the deflectors 23 and 26 in the polarized ion beam shaping section 36A are made of non magnetic material such as copper.

(Method for Generating the Spin Polarized Helium Ion)

Next, a procedure to generate the spin polarized helium ion by using the spin polarized ion beam generation apparatus 30 will be explained.

The wavelength of the optical fiber laser is adjusted so that the irradiation light for optical pumping has a wavelength of the $D_0$ line corresponding to the transition of metastable helium atom $2^3S_1$ to $2^3P_0$. The output light from the optical fiber laser ($D_0$ line) is input to the optical fiber amplifier 2 via the optical fiber. This input light is amplified by the optical fiber amplifier 2 and the amplified light is emitted from the optical fiber connector 3 to the space. The pumping light generator 33 provided in the optical fiber laser is used to adjust in advance this emitted light to be linearly polarized. The emitted light also may be linearly polarized by the glan laser prism.

The polarization direction of the light emitted to the space is adjusted by the half wavelength plate 5 and the path of light having an intensity about a half of the intensity of the light is changed by the half mirror 6. The light having the changed path is subsequently changed to circularly polarized light by the quarter wavelength plate 7 and the circularly polarized light is emitted to the discharging high frequency helium discharge tubes 12 and 15. The irradiation direction of this circularly polarized light is adjusted to be parallel to the magnetic field made by the coil 13. The DC power source 14 is adjusted so that the magnetic field made by the coil 13 is about 1 gauss.

On the other hand, the mirror 9 and the concave mirror 11 are adjusted so that the high frequency helium discharge tubes 12 and 15 is irradiated by the light passed the half mirror 6. The direction of this irradiated linearly polarized light is adjusted so as to be vertical to the magnetic field made by the coil 13. The polarization direction is adjusted by the half wavelength plate 10 so that a polarization component of this linearly polarized light is parallel to the magnetic field made by the coil 13.

Then, the spin polarized helium ion can be generated by finely adjusting a polarization rate of metastable helium atoms in plasma based on the method disclosed in Non Patent Document 2 so as to maximize the polarization rate. The method for observing the polarization rate of metastable helium atoms is not limited to the method of Non Patent Document 2 and also may be a method described later.

According to the spin polarized ion beam generation apparatus 30 of the present invention, the spin polarized ion beam having a high spin polarization rate can be generated. The spin polarized ion is not limited to spin polarized helium ion and all of ions that can be subjected to an electron spin polarization (e.g., $Cd^+$, $Sr^+$, $Zn^+$, $Ba^+$) can be used. When the ion is helium ion (He$^+$) in particular, the first and second pumping lights 34 and 35 can be the $D_0$ line.

By allowing the high frequency helium discharge tube 15 of the spin polarized ion beam generation apparatus 30 to have the extraction electrode 17 having the orifice plate 17B and the repeller electrode 20, the pressure in the high frequency helium discharge tube 15 can be within a range from 15 to 50 Pa. As a result, the spin polarized helium ion having a high spin polarization rate of about 25% can be generated. Only by the present invention, polarized helium ions having a high spin polarization rate can be generated for the first time.

Thus, the ion beam having a high spin polarization rate can be irradiate to the specimen 27 by reforming of the specimen 27 and the analysis of the surface of the specimen 27 using the spin polarized ion beam generation apparatus 30 of the present invention. This can reduce the processing time and the measurement time, improve the throughput and the processing accuracy, and effectively prevent the contamination of the surface of the specimen 27.

(Pumping Light Wavelength Adjuster)

Figure 19:
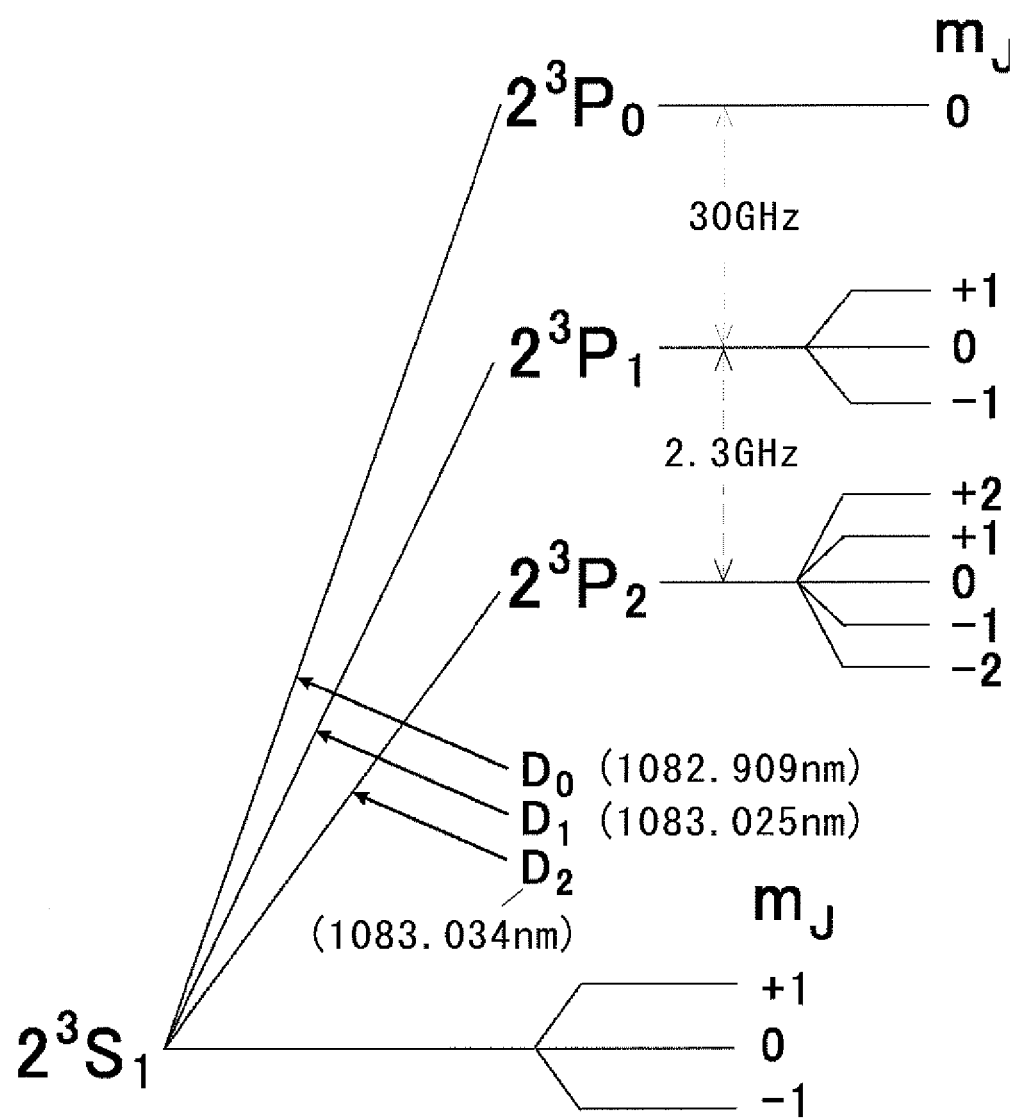
FIG. 19 illustrates energy levels related to the optical pumping of metastable helium atom $2^3S_1$.

The optical pumping used in the spin polarized ion beam generation apparatus 30 according to the first embodiment has a wavelength of the $D_0$ line and the wavelength is 1082.909 nm. On the other hand, the $D_1$ line and the $D_2$ line close to the $D_0$ line have wavelengths of 1083.025 nm and 1083.034 nm, respectively. The frequency difference between the $D_0$ line and the $D_1$ line is 30 GHz and the frequency difference between the $D_1$ line and the $D_2$ line is 2.3 GHz (see FIG. 19). Since the $D_0$ line is close to the $D_1$ line and the $D_2$ line, the laser oscillator 1 must be accurately adjusted so as to oscillate the wavelength of the $D_0$ line otherwise the He$^+$ polarization rate is reduced. Thus, a technique for accurately adjusting the laser oscillator 1 for generating the first and second pumping lights 34 and 35 to have a wavelength of the $D_0$ line is indespensable to generate the He$^+$ having a high polarization rate.

A pumping light wavelength adjuster for adjusting the wavelength of the laser oscillator 1 used in the spin polarized ion beam generation apparatus 30 to the $D_0$ line will be described.

Figure 7:
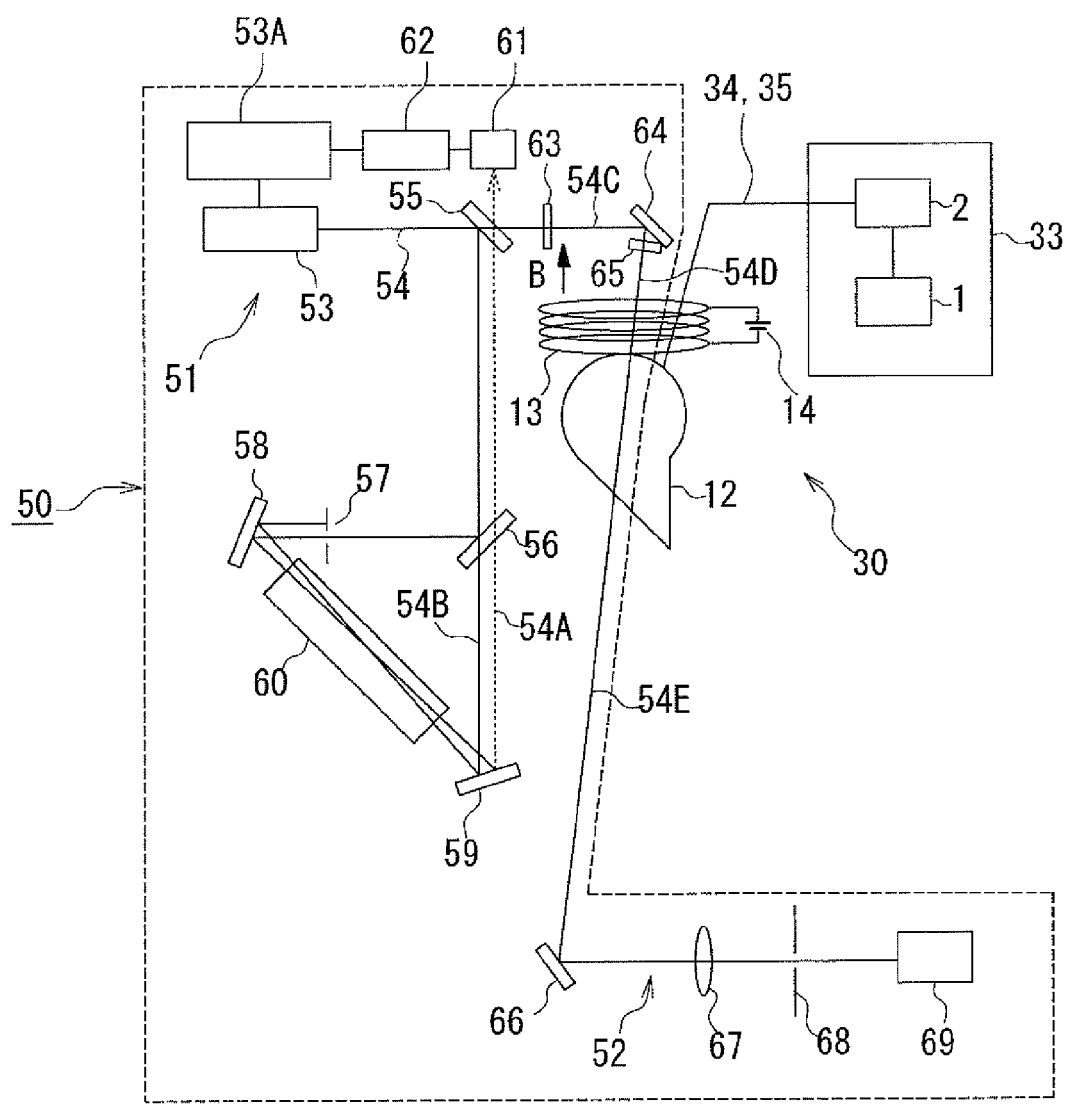
FIG. 7 is a schematic view illustrating the configuration of a pumping light wavelength adjuster used for the spin polarized ion beam generation apparatus.

FIG. 7 is a schematic view illustrating the configuration of a pumping light wavelength adjuster 50 used for the spin polarized ion beam generation apparatus 30. As shown in FIG. 7, the region surrounded by a dotted line denotes the pumping light wavelength adjuster 50 added to the spin polarized ion beam generation apparatus 30. The pumping light wavelength adjuster 50 is composed of: a probe light oscillator 51 for which the wavelength is adjusted to an accurate $D_0$ line; and a transmitted light measurement section 52.

The probe light oscillator 51 is constructed to be including: a probe light laser oscillator 53; a probe light laser oscillator power source 53A; a beam splitter 55; a half mirror 56; a slit 57; a first mirror 58; a second mirror 59; and a probe helium discharge tube 60 inserted to the first and second mirrors 58 and 59.

The optical path of the probe laser light 54 emitted from the probe light laser oscillator 53 is bent by the beam splitter 55 to the lower side in the vertical direction of the paper and is bent by the half mirror 56 to the left in the horizontal direction of the paper. Then, the probe laser light 54 passes through the slit 57 and passes the probe helium discharge tube 60 via the first mirror 58 and is reflected by the second mirror 59. Next, the light passes the half mirror 56 again and passes the beam splitter 55 to enter a light detector 61. In FIG. 7, an optical path 54A from the second mirror 59 to the light detector 61 is shown by the dotted line.

The probe laser light 54B which passes the half mirror 56 to the lower side in the vertical direction of the paper is reflected by the second mirror 59. Then, the light passes the probe helium discharge tube 60 and is reflected by the first mirror 58 but does not pass the slit 57.

In the probe helium discharge tube 60 of the probe light oscillator 51, the two probe laser lights 54A and 54B intersect to each other as described above and the probe laser light 54A there among reaches the light detector 61 to measure the absorption in the probe helium discharge tube 60 to carry out a so called saturated absorption spectroscopy. The existence of the two probe laser lights 54A and 54B intersecting to each other can eliminate the influence by the Doppler effect in the measurement of the absorption.

The output from the light detector 61 is input to a lock-in amplifier 62. Since the probe light laser oscillator power source 53A is feedback controlled by the output from the lock-in amplifier 62, the wavelength of the probe light laser oscillator 53 is adjusted to be the accurate $D_0$ line. As for the probe light laser oscillator 53, a laser diode in which wavelength can be controlled by current may be used. By the wavelength control as described above, the wavelength of the probe light is stabilized to 5 MHz or less.

Next, the transmitted light measurement section 52 will be described.

The transmitted light measurement section 52 is composed of: an attenuator 63; a third mirror 64; a quarter wavelength plate 65; a fourth mirror 66; a lens 67; a slit 68; and a transmitted light detector 69.

Probe light 54 having the $D_0$ line emitted from the probe light oscillator 51 passes a beam splitter 55 to change into light 54C. The light 54C is emitted to the right side in the horizontal direction of the paper and passes the attenuator 63 such as an ND filter, the third mirror 64 and the quarter wavelength plate 65 and is converted to circularly polarized light 54D polarized in the counterclockwise or clockwise direction. The probe light having passed the attenuator 63 generally has an intensity of about 1 mW or lower. This circularly polarized probe light 54D enters the high frequency discharge tube 15 in a direction parallel to the direction of a magnetic field B. Thus, the circularly polarized probe light 54D travels in the same travelling direction as that of the first pumping light 34. A probe light 54E emitted from the high frequency discharge tube 15 passes the fourth mirror 66, the lens 67 and the slit 68 to subsequently enter the transmitted light detector 69.

The probe light 54 enters the transmitted light detector 69 so that all of optical paths in the high frequency discharge tube 15 are superposed with the pump light. The light intensity, which is measured by a power meter when no discharge is carried out through the high frequency discharge tube 15, is controlled to have a value that is 10% or less to the pump light by finely adjusting the optical axis of the probe light 54 as well as the shapes and the geometric positional relation of the mirror 66, the lens 67, and the slit 68 after the emission from the high frequency discharge tube 15.

The intensity of the probe light 54E having passed the helium plasma in the high frequency discharge tube 15 is measured by the transmitted light detector 69 such as a power meter. When assuming that the transmission intensity of the probe light 54E is I and the intensity of the entered probe light 54C is $I_0$, the density of the metastable helium atom (He*) of $m_j=+1$ is $n_+$, and the density of the metastable helium atom (He*) of $m_j=-1$ is $n_-$, the transmission intensity I (rhcp) by the circularly polarized light in the clockwise direction (rhcp) and the transmission intensity I (lhcp) by the circularly polarized light in the counterclockwise direction (lhcp) are represented by the following formulae (3) and (4).

$$I(rhcp) = I_0(rhcp)\exp(n_-\sigma L) \tag{3}$$

$$I(lhcp) = I_0(lhcp)\exp(n_+\sigma L) \tag{4}$$

where rhcp and lhcp denote the respective circularly polarized lights in the clockwise and counterclockwise directions, σ denotes the light absorption cross section and L denotes a propagation length of the probe light in plasma.

According to the definition of the polarization rate ((n↑−n↓)/(n↑+n↓)), when the absolute value $n_+ - n_-$ becomes higher, the higher polarization rate He* has given. When the wavelength of the first pumping light 34 is adjusted to be the $D_0$ line so as to maximize the absolute value of $n_+ - n_-$ on the contrary, the maximum polarization rate of He* is obtained. This method is called "the method for measuring a polarization rate of metastable helium atoms of the present invention".

The absolute value of $n_+ - n_-$ is maximum when the absorption of the circularly polarized probe light 54D is maximum or minimum, as can be seen from the formulae (3) and (4). This absorption is maximum or minimum only depending on whether the spin of He* is in an upward or downward direction. Thus, the quarter wave plate 65 may be adjusted to provide the circularly polarized light in the clockwise or counter clockwise direction. Specifically, the spin direction of He* may be controlled in the upward or downward by adjusting the quarter wavelength plate 65.

In the pumping light wavelength adjuster 50, the adjustment of the wavelengths of the first and second pumping lights 34 and 35 to the $D_0$ line is performed accurately by the following procedure.

First, the first pumping light 34 is irradiated to enter He plasma in the high frequency discharge tube 15 to measure the absorption by a power meter. After the wavelength of the first pumping light 34 is scanned to measure the three absorptions corresponding to the $D_0$, the $D_1$, and the $D_2$ lines, it is roughly adjusted to the $D_0$ line of about 1083 nm. When the probe light oscillator 51 is in a stopped status in the above measurements, the absorption of the first pumping light 34 can be detected by the fourth mirror 66, the lens 67, the slit 68, and the transmitted light detector 69 of the transmitted light measurement section 52. The transmitted light detector 69 may be a power meter.

Next, an accurate $D_0$ line is generated from the pumping light wavelength adjuster 50 by the saturated absorption spectroscopy. This probe light 54 is irradiated to enter the high frequency discharge tube 15 via the transmitted light measurement section 52. Then, the wavelength of the laser oscillator 1 for generating the pumping lights 34 and 35 may be adjusted so that the output from the transmitted light detector 69 i.e., the absorption of the probe light 54E, is maximum or minimum.

In the conventional technique, there are a plurality of methods for calculating a He* polarization rate during discharge. It is possible for these methods in principle to adjust, while measuring the He*polarization rate, the wavelengths of the first and second pumping lights 34 and 35 so that the He*polarization rate is maximum to adjust the first and second pumping lights 34 and 35 to the $D_0$ line. However, any of these methods has been required to carry out an operation to scan the wavelength of the probe light to measure the absorption with regard to the respective polarizations (e.g., in clockwise, counterclockwise, and straight directions). Due to this reason, the measurement of the polarization rate has required a long time. Thus, it has been practically impossible to accurately adjust the wavelength while measuring the polarization rate.

In contrast with the above conventional techniques, according to the pumping light wavelength adjuster 50 of the present invention, the transmission intensity of the polarization by clockwise or counterclockwise polarization may be measured by a power meter 69 to adjust the transmission intensity so as to be maximum or minimum. Thus, the wavelength can be adjusted easily.

According to the pumping light wavelength adjuster 50, the spin polarized ion beam can be generated with a further reduced time. Thus, when the spin polarized ion beam generation apparatus 30 of the present invention added with the pumping light wavelength adjuster 50 is used to reform the specimen 27 or to analyze the surface of the specimen 27, the processing time and the measurement time can be further reduced to improve the throughput and to improve the processing accuracy, thus effectively preventing the contamination of the surface of the specimen 27. When the laser oscillator outputs laser light that has a wavelength adjusted so that the polarization rate of a metastable atom as a base of an ion that is calculated by the measurement of the absorption of the probe laser is maximum, the wavelength of the pumping light can be accurately adjusted as in the case of the above metastable helium atom.

Second Embodiment

Next, a spin polarized ion scattering spectroscopy apparatus according to a second embodiment will be described.

Figure 8:
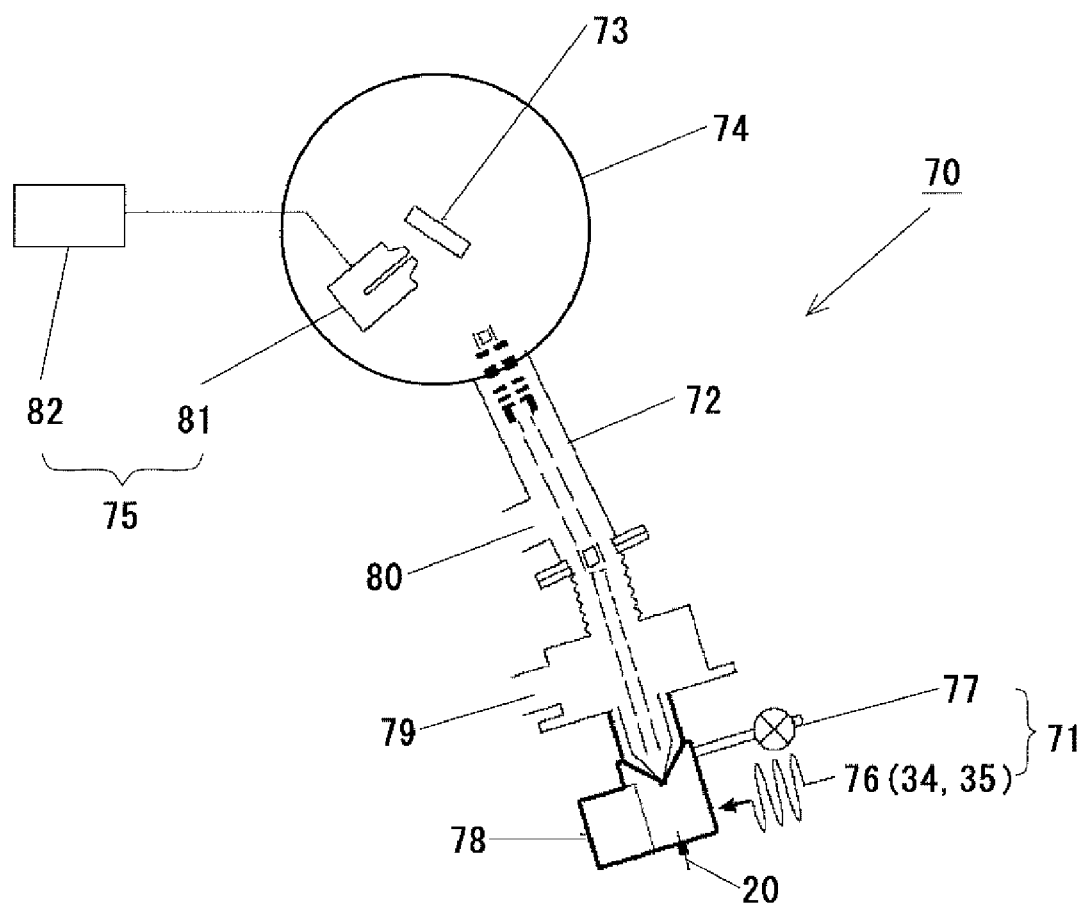
FIG. 8 is a schematic view illustrating the configuration of a spin polarized ion scattering spectroscopy apparatus according to the second embodiment of the present invention.

FIG. 8 is a schematic view illustrating the configuration of the spin polarized ion scattering spectroscopy apparatus 70 according to the second embodiment. The spin polarized ion scattering spectroscopy apparatus 70 of FIG. 8 is composed of: a spin polarized ion beam generator 71 for generating spin polarized ions; a spin polarized ion beam line 72 for causing the spin polarized ion from the spin polarized ion beam generator 71 to enter the surface of a specimen with a predetermined energy; an ultrahigh vacuum chamber 74 for retaining the specimen 73; and a measurement section 75 that is positioned in the ultrahigh vacuum chamber 74 and that measures spin polarized ion emitted to the specimen 73 to be scattered therefrom. As will be described later, the measurement section 75 is composed of: an electrostatic analyzer 81 provided in the ultrahigh vacuum chamber 74; an electrostatic analyzer power source 81A; and a computer 82 for processing a detection signal from the electrostatic analyzer 81 for example. The computer 82 is provided outside of the ultrahigh vacuum chamber 74 and may be a personal computer or the like.

The spin polarized ion beam generator 71 emits the optical pumping irradiation light 76 to the high frequency helium ion source 78 into which helium gas is introduced from the helium gas inlet 77 to generate spin polarized helium ions.

The generated spin polarized helium ion is irradiated to the specimen 73 placed in the ultrahigh vacuum chamber 74 with a predetermined energy by using the polarized helium ion beam line 72 including differential evacuation ports 79 and 80. The ion energy is controlled by an electric field that is used when a spin polarized helium ion is extracted from the spin polarized ion beam generator 71 to the spin polarized ion beam line 72.

The incident angle of the incident ion to the surface of the specimen is controlled by rotating the specimen 73 in a direction vertical to the incident ion beam. A part of the incident ion is not neutralized at the surface of the specimen and is scattered. This scattered ion is detected by the electrostatic analyzer 81 in the measurement section 75. The detection signal is processed by the computer 82.

Figure 9:
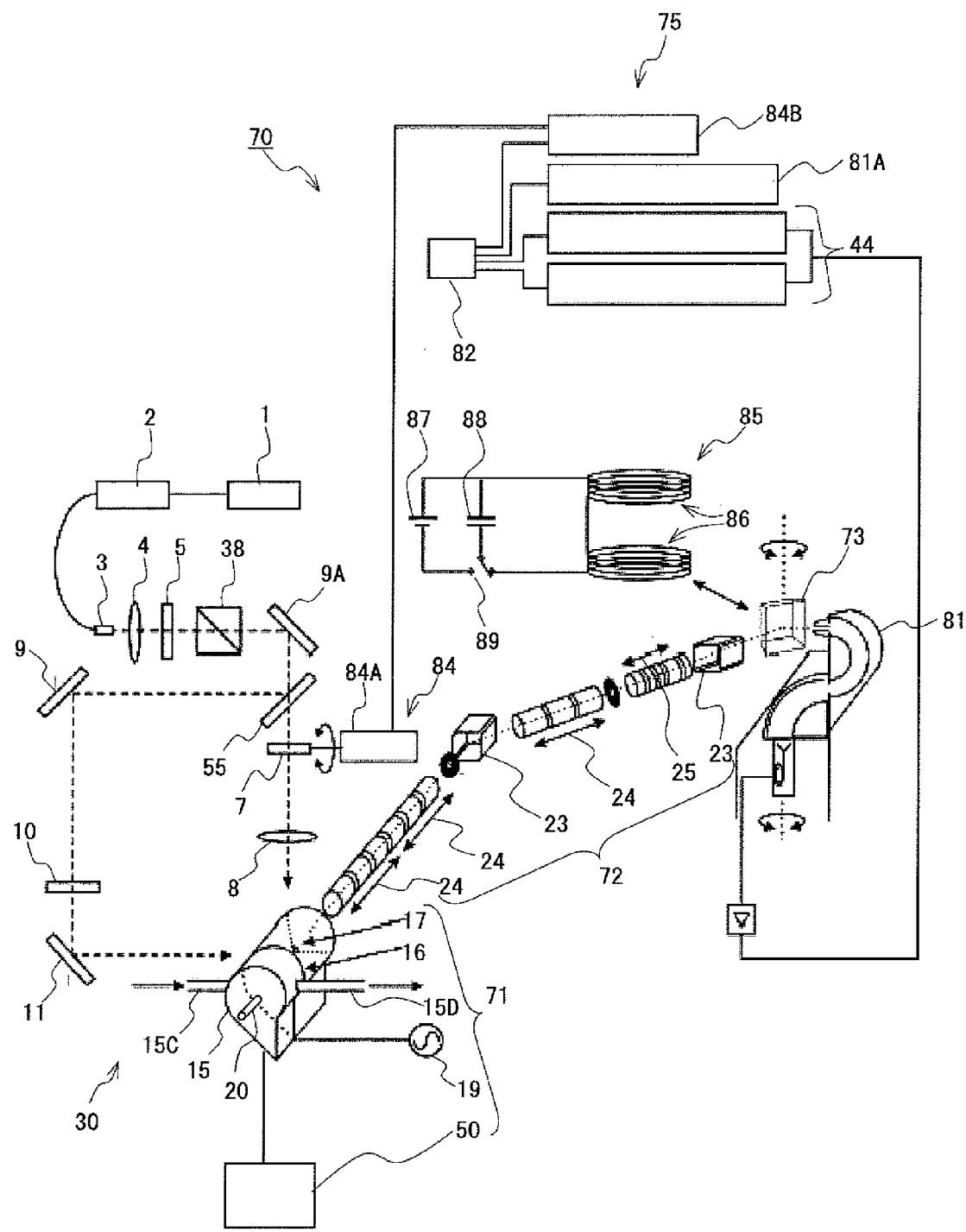
FIG. 9 is a schematic view illustrating a specific configuration of the spin polarized ion scattering spectroscopy apparatus according to the second embodiment.

FIG. 9 is a schematic view illustrating a specific configuration of the spin polarized ion scattering spectroscopy apparatus 70 according to the second embodiment. The spin polarized ion beam generator 71 may be the polarized ion beam generation apparatus 30 described in the first embodiment of the present invention and the modification example thereof. The shown spin polarized ion beam generator 71 is different from the polarized ion beam generation apparatus 30 of FIG. 1 in that a glan laser prism 38 is inserted between the lens 4 and the mirror 9A. According to this configuration, the polarization direction of the light emitted from the laser oscillator 1 can be controlled to polarize linearly by the combination of the half wavelength plate 5 and the glan laser prism 38. The second difference is that a circularly polarized light controller 84 is provided for the first pumping light 34 irradiated to enter the high frequency discharge tube 15.

The circularly polarized light controller 84 is composed of: a motor 84A for controlling the quarter wavelength plate 7; and a motor driving section 84B. The motor driving section 84B is controlled by the computer 82 and can control the circularly polarized light of the first pumping light 34 in a clockwise or counterclockwise direction. The circularly polarized light controller 84 also may include a pumping light wavelength adjuster 50 for accurately adjusting the first and second pumping lights 34 and 35 to be the $D_0$ line.

The spin polarized ion beam line 72 is composed of: einzel lenses 24; deflectors 23, einzel lenses 24 and 25, and the deflectors 23 arranged in this order.

The analysis chamber consisting of the ultrahigh vacuum chamber 74 includes a not shown specimen stage for controlling the position of the specimen 73. The specimen stage is controlled in its position by a manipulator 97 that is disposed outside of the ultrahigh vacuum chamber 74 and it controls the incident angle of the spin polarized helium ion to the specimen 73.

The ultrahigh vacuum chamber 74 also may include a specimen magnetization section 85 for applying a magnetic field to the specimen 73. The specimen magnetization section 85 includes: a specimen magnetization coil 86; a DC power source 87; a capacitor 88; and a switch 89. First, the switch 89 is connected to the DC power source 87 to charge the capacitor 88. After the charge is ended and the switch 89 is connected to the specimen magnetization coil 86 as shown in FIG. 9, a pulsed current is flown in the specimen magnetization coil 86 and the specimen magnetization coil 86 generates a pulse magnetic field. This pulsed magnetic field can be used to change the magnetization direction of the specimen 73. The capacitor 88 is an electrolytic capacitor having a capacity of 330 µF and has a withstand voltage of 500V. The voltage of the DC power source 87 is 360V.

Figure 10:
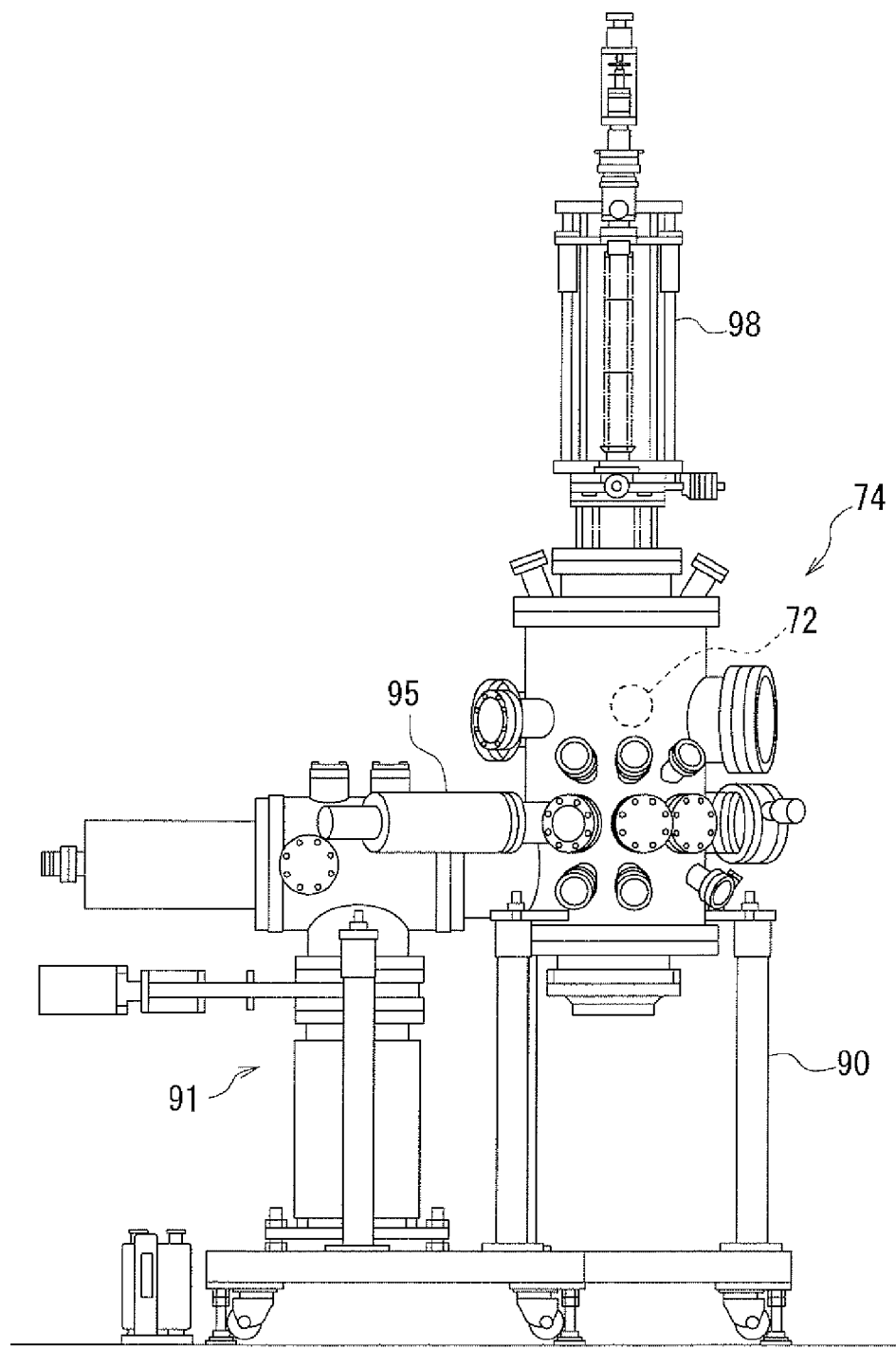
FIG. 10 is a front view illustrating an example of the configuration of an ultrahigh vacuum chamber.
Figure 11:
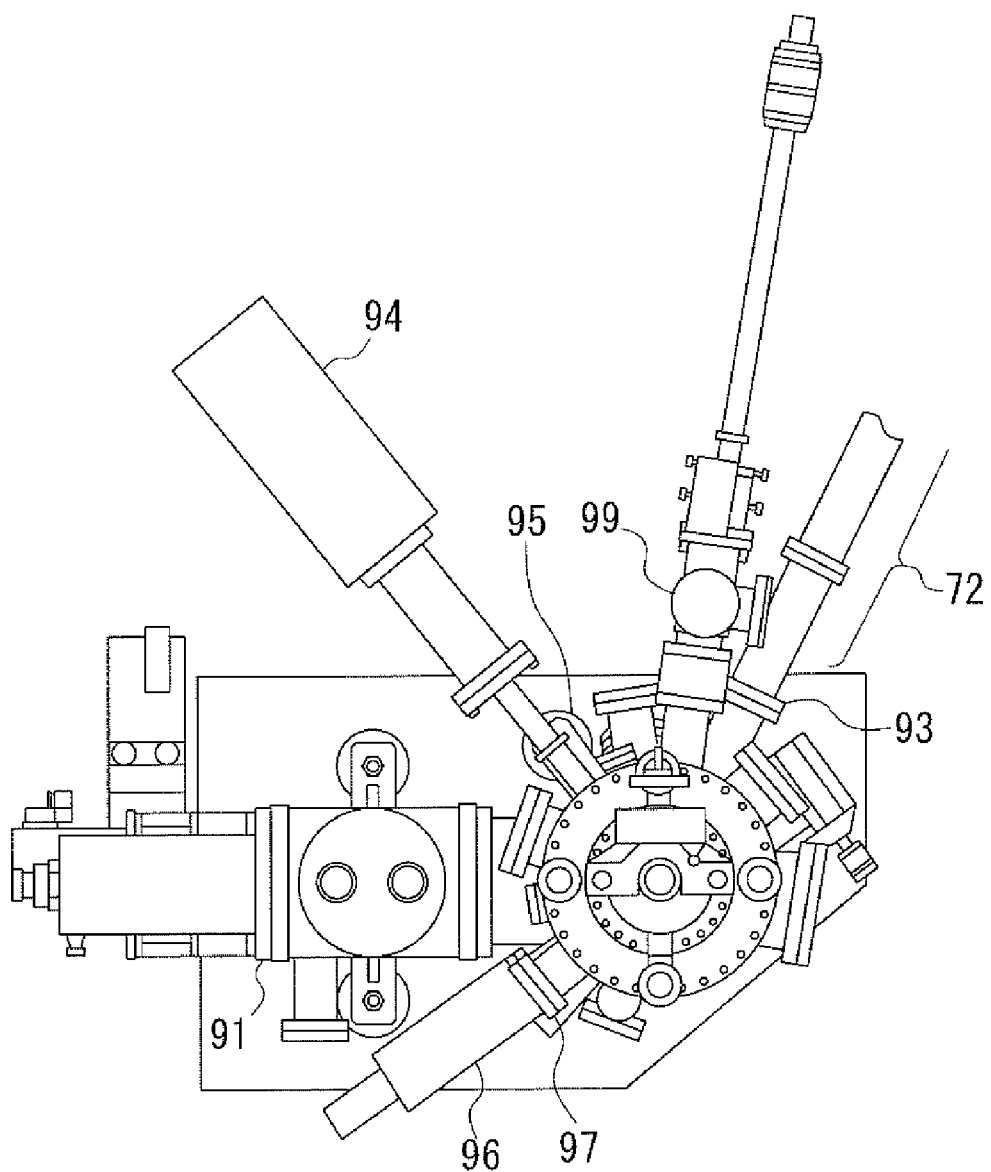
FIG. 11 is a top view illustrating an example of the configuration of the ultrahigh vacuum chamber.

FIG. 10 and FIG. 11 are a front view and a top view illustrating a configuration example of the ultrahigh vacuum chamber 74, respectively.

The ultrahigh vacuum chamber 74 is provided on a mount stand 90. The ultrahigh vacuum chamber 74 includes a vacuum evacuation section 91 consisting of a turbo molecular pump or the like and includes a port 93 to which the spin polarization beam line 72 of the present invention is connected. A not shown electrostatic analyzer 81 is provided in the ultrahigh vacuum chamber 74. This ultrahigh vacuum chamber 74 further includes, in addition to a port 95 to which a Stern Gerlach analyzer 94 for measuring the polarization rate of a metastable helium atom is connected, a port 97 to which an analysis device such as a RHEED 96 can be connected (which will be described later). A not shown apparatus for generating a metastable helium atom is attached to the position opposed to the Stern Gerlach analyzer 94 of the ultrahigh vacuum chamber 74. A manipulator 98 for controlling the position of the specimen stage is disposed on the upper part of the ultrahigh vacuum chamber 74. The specimen 73 can be placed via a specimen carrying section (load lock) 99 into the ultrahigh vacuum chamber 74 without breaking the ultrahigh vacuum atmosphere.

Next, an analysis method by the spin polarized ion scattering spectroscopy apparatus 70 will be explained.

First, when not polarized ion beam is irradiated to the specimen 73, the conventional ion scattering spectroscopy (hereinafter called ISS) can be carried out.

FIGS. 12A and 12B illustrate ion scattering spectroscopy. FIG. 12A is a schematic view of the ion scattering spectroscopy. FIG. 12B illustrates a spectroscopy spectrum obtained by the ion scattering spectroscopy.

As shown in FIG. 12A, when helium ion having a kinetic energy of about 1 to 10 keV enters the specimen 73, the most part of helium ion is neutralized through the interaction with the substrate surface and is changed to a helium atom having a ground state. In this interaction, when the intensity of scattered ion which is not neutralized is analyzed by the electrostatic analyzer 81 or the like as a function of the kinetic energy, a composition analysis of atoms existing in a few atoms or a few molecular layers of the surface of the specimen 73 can be possible.

The peak positions A and B as shown in FIG. 12B mean the energy calculated based on the classical binary collision of the incident ion to a target atom. This calculating formula is represented as follows (see Non Patent Document 11):

$$E_1 = E_0 (M_1/M_1+M_2)^2 [\cos \theta \pm (M_1^2/M_1^2 - \sin^2\theta)^{1/2}]^2$$

where $E_1$ and $E_0$ represent incident energy and scattering energy, $M_1$ and $M_2$ represent the mass of the incident ion and the target atom, and $\beta$ is a scattering angle.

The spin polarized ion scattering spectroscopy apparatus 70 can emit polarized ion beam to the specimen 73 to carry out the spin polarized ion scattering spectroscopy (hereinafter called 'SP-ISS'). This method is a new spectroscopy that is impossible in the conventional technique.

FIGS. 13A, 13B and 13C illustrate the spin polarized ion scattering spectroscopy. FIG. 13A is a schematic view of the spin polarized ion scattering spectroscopy. FIG. 13B illustrates spectroscopy spectra obtained by the spin polarized ion scattering spectroscopy. FIG. 13C illustrates a difference spectrum calculated based on the spectrum of FIG. 13B.

As shown in FIG. 13A, when a spin polarized helium ion having kinetic energy of about 1 to 10 keV enters the specimen 73, the most part of helium ion is neutralized through the interaction with substrate surface as described above and is changed to a helium atom in a ground state. In this interaction, when the intensity of scattered ion which is not neutralized is analyzed by the electrostatic analyzer 81 or the like as a function of the kinetic energy, a composition analysis of atoms existing in a few atoms or a few molecular layers of the surface of the specimen 73 can be performed. Furthermore, in accordance with the spin of the atom existing in the surface of the specimen 73, a change in the scattering intensity depending on whether the spin is parallel or antiparallel can be measured by changing the direction of the spin of the spin polarized helium ion.

FIG. 13C illustrates a difference spectrum calculated based on the spectrum obtained in FIG. 13B. Although will be described later, this value can be used to also determine whether the spin owned by the detected element is positive or negative.

Furthermore, the respective atomic layers at a depth from the outermost surface of the specimen 73 to about a few atomic layers can be analyzed with regards to the element and spin status by measuring the dependency on the incident angle of the polarized helium ion beam to the specimen 73.

Specifically, the spin polarized ion scattering spectroscopy spectrum mentioned above can be obtained by an analysis using the computer 82 of the detection value of the electrostatic analyzer 81 of the spin polarized ion scattering spectroscopy apparatus 70. The analysis is carried out based on a following procedure.

(a) The specimen 73 is pulse magnetized in a direction parallel to the direction of the magnetic field surrounding the specimen.

(b) The scattering intensity of the helium ion spin polarized in parallel with the magnetization is measured by the electrostatic analyzer 81 for a fixed time.

(c) The scattering intensity of the helium ion spin polarized antiparallel to the magnetization is measured by the electrostatic analyzer 81 for the same time as that of the above (a).

(d) In order to remove the effect by a temporal change, the measurements of (a) and (b) are repeated a predetermined times.

(e) After the series of measurements, the signal intensities obtained through the repeated measurements (a) and (b) are counted by the computer 82 with regard to the respective spin directions. Thus, a required spin polarization scattered ion intensity can be obtained finally.

Since a probability at which the incident ion species is neutralized at the surface of the specimen depends on the magnetic structure of the surface, the above spin polarized ion scattering spectroscopy can be carried out. The incident ion species showing the phenomenon as described above is not limited to helium ion and also may be all ions that can be subjected to electron spin polarization (e.g., $Cd^+$, $Sr^+$, $Zn^+$, $Ba^+$) or an atom (e.g., Li, Na, K, Rb, Cs (see Non Patent Documents 9 and 10)).

According to the spin polarized ion scattering spectroscopy apparatus of the present invention, a surface spin analysis can be made to be discriminated from an atom and an atomic layer at two to three atomic layers of the outermost surface of a specimen. Thus, this can provide the analysis of the magnetic structure in a region at a depth of about two to three atomic layers from the outermost surface. Furthermore, when the spin polarized ion is irradiated to enter the surface of the specimen, the energy analysis of the scattered ion with regards to the respective spins of the incident ion, i.e., spin polarization measurement, can be performed. Thus, the spin dependency of the probability of the neutralization of the incident ion at the surface of the specimen can be measured.

Third Embodiment

Next, a specimen processing apparatus using spin polarized ion beam according to a third embodiment will be described.

Figure 14:
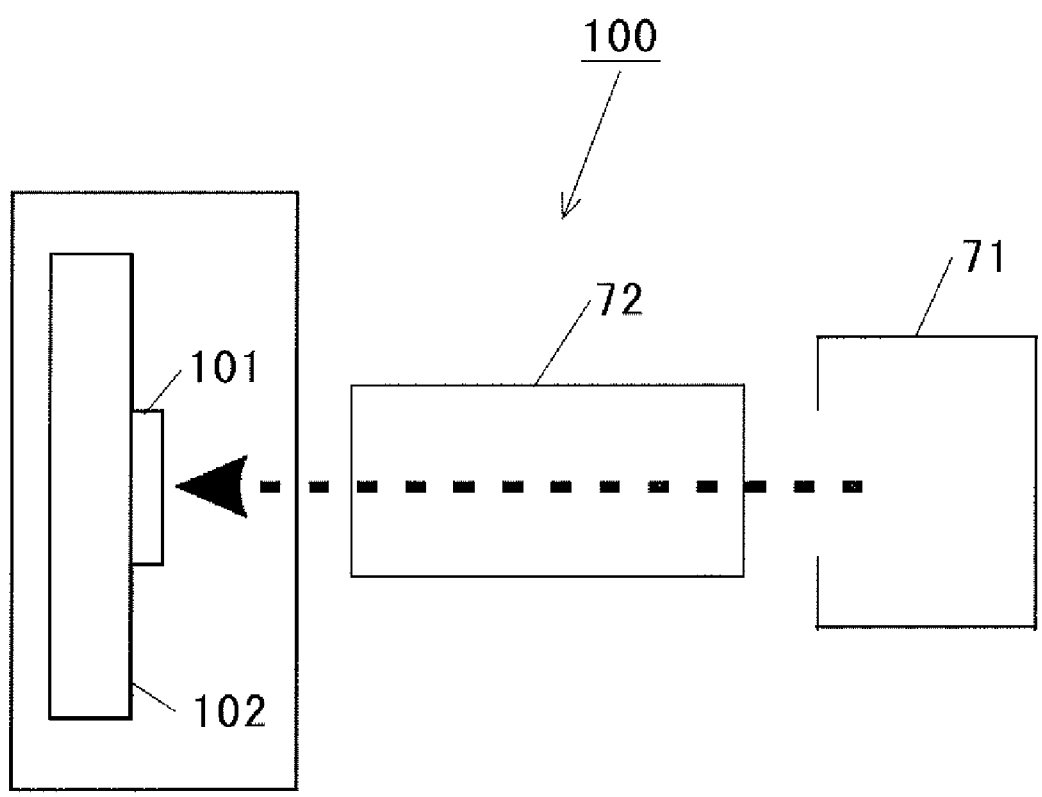
FIG. 14 is a schematic view illustrating the configuration of a specimen processing apparatus using spin polarized ion beam according to the third embodiment of the present invention.

FIG. 14 is a schematic view illustrating the configuration of the specimen processing apparatus 100 using spin polarized ion beam according to a third embodiment of the present invention. The specimen processing apparatus 100 using spin polarized ion beam is composed of: the spin polarized ion beam generator 71 using the polarized ion beam generation apparatus 30 described in the first embodiment; the spin polarized ion beam line 72 connected to this spin polarized ion beam generator 71; and an ultrahigh vacuum chamber 103 including a specimen holding section 102 in which a specimen 101 as an object to be processed is placed for example.

The spin polarized ion beam generator 71, the spin polarized ion beam line 72 and the ultrahigh vacuum chamber 103 can have the same configuration as in the spin polarized ion scattering spectroscopy apparatus 70. The spin polarized ion generated from the spin polarized ion beam generator 71 is transported by an electric field for example to the spin polarized ion beam line 72. Depending on the object of the processing of the specimen, the spin polarized ion beam line 72 performs a beam shaping or a beam operation such as to narrow the diameter of the beam, to increase the diameter of the beam, or to scan the beam. Generally, since the ion beam current depends significantly on the vacuum degree of the spin polarized ion beam line 72, thus, the sufficient evacuation is needed. The polarized ion beam having the desired shape as described above is finally irradiated to the specimen 101 as an object to be processed to subject the specimen 101 to a surface reforming, ion implantation, or a surface processing for example. This object to be processed 101 is generally retained in vacuum atmosphere. When the surface is highly reactive for example, the object to be processed 101 is retained in ultrahigh vacuum atmosphere.

In order to measure the beam intensity of spin polarized ion for example, the ultrahigh vacuum chamber 103 also may include various analyzers such as the electrostatic analyzer 81 as in the spin polarized ion scattering spectroscopy apparatus 70.

According to the specimen processing apparatus 100 using spin polarized ion beam of the third embodiment of the present invention, a new specimen processing apparatus that can process the outermost surface of the specimen 101 by spin polarized ion beam can be provided. Even if using the same processing method as in the conventional technique, a processing accuracy of this specimen processing apparatus 100 based on the dependency on the spin of the interaction between ion and the object to be processed can be raised 1.5 times or more higher than that of the conventional case. Highly polarized ion beam enabled by the present invention can be used for the reforming of a specimen or the control of the spin in a step of manufacturing a device using spin conduction for example, thus providing more sophisticated material.

Example 1

Next, the present invention will be described in more details based on Examples.

The spin polarized ion beam generation apparatus 30 of Example 1 uses the high frequency helium discharge tube 15 and the polarized ion beam shaping section 36 as shown in FIG. 1 to FIG. 7. The main body 15A and the extraction electrode insertion section 15F of the high frequency helium discharge tube 15 are made of Pyrex® glass. The flange 15B, the He gas inlet 15C, the He gas outlet 15D and the wiring port 15E are composed of flange or piping components made of a stainless. The Pyrex® glass of the main body 15A was joined to flange or piping components made of a stainless by using Kovar®.

The orifice plate 17B in the extraction electrode 17 had a fine pore having a diameter d of 0.5 mm and a length L of 0.8 mm. The distance between the extraction electrode 17 and the repeller electrode 20 was 50 mm. Voltages of 1.26 kV and 1.44 kV were applied to the extraction electrode 17 and the repeller electrode 20, respectively. High frequency discharge was carried out by the high frequency power source 19 having a frequency of 13.56 MHz and an output of 500 W. However, the high frequency power source 19 was generally used with 5 W or lower.

The spin polarized ion beam generation apparatus 30 of Example 1 was used to generate spin polarized helium ion based on the following procedure.

Output light having a wavelength of optical fiber laser of about 1083 nm ($D_0$ line) was input via the optical fiber to the optical fiber amplifier 2. This input light was amplified by the optical fiber amplifier 2 and the amplified light was emitted from the optical fiber connector 3 to the space. The optical fiber amplifier 2 was adjusted to have an output of 3 W.

A polarizer provided in the optical fiber laser was used to adjust this emitted light to be linearly polarized in advance. In this case, the polarization direction of the emitted light also could be adjusted to be linearly polarized by optically arranging the emitted light from the optical fiber laser by a combination of the glan laser prism and the half wavelength plate.

The polarization direction of the light emitted to the space was adjusted by the half wavelength plate 5 and the half mirror 6 was used to change the path of light having an intensity that is about a half of the intensity of the light. Next, the light having the changed path was converted to the circularly polarized light ($\sigma$ light) by the quarter wavelength plate 7 and the light was irradiated to the high frequency helium discharge tube 12. The irradiation direction of this circularly polarized light was adjusted so as to be parallel to the magnetic field made by the coil 13. The DC power source 14 was also adjusted so that the magnetic field made by the coil 13 was about 1 gauss. On the other hand, the mirror 9 and the concave mirror 11 were adjusted so that the light having passed the half mirror 6 irradiated the discharge tube 12. The irradiation direction of this linearly polarized light ($\pi$ light) was adjusted to be vertical to the magnetic field made by the coil 13. The half wavelength plate 10 was used to adjust the polarization direction so that a polarization component of the linearly polarized light ($\pi$ light) was parallel to the magnetic field made by the coil 13. The wavelength of the irradiation light of the optical pumping was adjusted to the $D_0$ line corresponding to the transition of the metastable helium atom $2^3S_1$ to $2^3P_0$.

The polarization rate of a metastable helium atom in plasma generated by the above method was finely adjusted to be maximum through the observation by the method disclosed in Non Patent Document 2. It was confirmed that not only the method disclosed in Non Patent Document 2 but also the method described in the section "the method of measuring a polarization rate of a metastable helium atom of the present invention" could be used to finely adjust the polarization rate of the metastable helium atom so as to be maximum.

Next, the polarization rate of an ion generated in the polarized helium ion source was evaluated by the system as shown in FIG. 2 for measuring the polarization rate of the polarized ion.

First, the helium plasma was generated in the high frequency helium discharge tube 15 by using high frequency power sources 16 to 19 for example. Next, the metastable helium atom $2^3S_1$ in this plasma was spin polarized by the optical pumping as shown in FIG. 1. The polarized helium ion was generated by using the Penning ionization reaction of this polarized metastable helium atom.

This polarized helium ion was transported to an O/Fe/MgO magnetic substrate 27 by the repeller electrode 20, the extraction electrode 17, the lenses 21, 22 and 24, the deflectors 23 and 26, and the decelerator 25.

The O/Fe/MgO magnetic substrate 27 was obtained through the following manufacture method.

First, an Fe single crystal thin film of about 50 nm having a body centered cubic structure was grown on a MgO (001) single crystal substrate at room temperature. This substrate was heated in vacuum at about 600 degrees C. for 10 minutes to subsequently expose this substrate to oxygen atmosphere of 100 Langmuir. Then, the substrate was heated in vacuum at about 500 degrees C. for 10 minutes to pulse magnetize the substrate in vacuum.

The most part of the polarized helium ion reaching to the O/Fe/MgO substrate 27 is neutralized through the interaction with the substrate surface and is changed to a helium atom in a ground state. Through this interaction, electrons are emitted from the O/Fe/MgO substrate 27. The intensity of this electron was measured as a function of the kinetic energy with regard to the respective directions of the spins of the polarized ion by the electrostatic analyzer 41, the secondary electron multiplier 42, the preamplifier 43, the multichannel scaler 44 and the personal computer 45. The direction of the polarization of the helium ion (upward or downward) was controlled by the direction of the quarter wavelength plate 7 of FIG. 1.

By obtaining the polarization rate of metastable helium atom by the Stern Gerlach analyzer 94 in advance, the absolute value of the polarized ion was calculated to compare the emitted electron spectrum of the metastable helium atom (spin polarized metastable atom deexcitation spectroscopy) with the emitted electron spectrum of the polarized ion at the same surface (spin polarized ion neutralization spectroscopy). In advance, the polarization rate of the helium ion at the helium pressure of 20 Pa was obtained to be 16.6% by using this method (see Non Patent Document 12 for the details).

The polarization rate of the helium ion in Example 1 and the conventional technique was investigated as a function of a helium gas pressure in a discharge tube.

Figure 15:
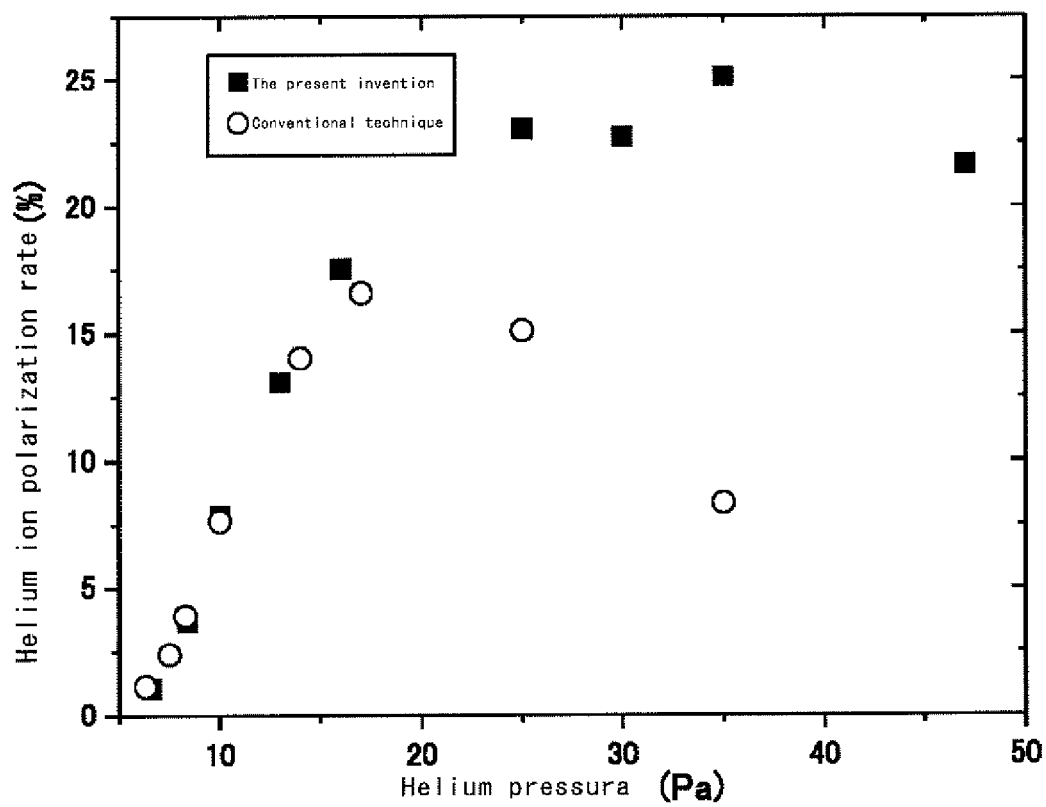
FIG. 15 is a graph that shows the result of Illustrative Example 1 and that shows a change in the polarization rate in accordance with a change in the helium pressure.

FIG. 15 is a graph that shows the result of Example 1 and that shows a change in the polarization rate in accordance with a change in the helium pressure. In FIG. 15, the abscissa axis shows the helium gas pressure (Pa) in the discharge tube and the ordinate axis shows the helium ion polarization rate (%). The polarization rate was measured with the power of the high frequency power source 18 adjusted to 1 W. This graph is plotted based on an assumption that the polarization rate when the helium pressure was 15 Pa was equal to the polarization rate of 16.6% calculated in advance at 20 Pa. FIG. 15 also shows the conventional data for comparison. The spin asymmetricity rate was calculated by measuring electrons having a kinetic energy of 7.7 eV to 9.4 eV. The optical pumping according to the conventional technique was carried out as follows. While the mirror 9 of FIG. 1 was inclined so as to prevent linearly polarized irradiation light from irradiating the high frequency helium discharge tube 15, the wavelength of the irradiation light was adjusted to the $D_1$ line.

As can be seen from FIG. 15, the maximum value of the polarization according to Example 1 is 1.5 times or more higher than that of the conventional technique. Specifically, according to the spin polarized ion beam generation apparatus 30 of the present invention, the helium ion polarization rate at the helium pressure of 15 Pa (see the black squares (■) in FIG. 15) is about 17.5% that exceeds the helium ion polarization rate of the conventional value (see the white circles (○) in FIG. 15). It shows that the helium ion polarization rate at a pressure in a range from 15 Pa or more to about 50 Pa is as high as 20 to 25%. The upper limit of the helium pressure is preferably about 50 Pa or less. The reason is that when the helium pressure is 50 Pa or more, the amount of helium flown into the polarized ion beam shaping section 36 will be increased.

Example 2

The spin polarized ion beam generation apparatus 30 of Example 2 having the pumping light wavelength adjuster 50 as shown in FIG. 7 attached to the spin polarized ion beam generation apparatus 30 of Example 1 will be described.

The probe light laser oscillator 53 used was the laser diode (SDL 6072 made by SDL, Inc.). The light detector 61 for absorption spectroscopy was a photo diode. The signal from the photo diode 61 was amplified by the lock-in amplifier 62 and this output was used to feedback control of the laser diode power source (SDL-803 made by SDL, Inc.). The time required for the wavelength control of the first and second pumping lights 34 and 35 has reduced to about ⅒ or lower time by using the pumping light wavelength adjuster 50.

Example 3

The specimen 73 was analyzed by using the spin polarized ion scattering spectroscopy apparatus 70 as explained in FIG. 8 to FIG. 13. The spin polarized ion beam generator 71 has the same configuration as that of the spin polarized ion beam generation apparatus 30 of Example 1. The specimen 73 was measured by the above procedures of (a) to (e). The parallel and antiparallel cases were measured 100 times, respectively.

Figure 16:
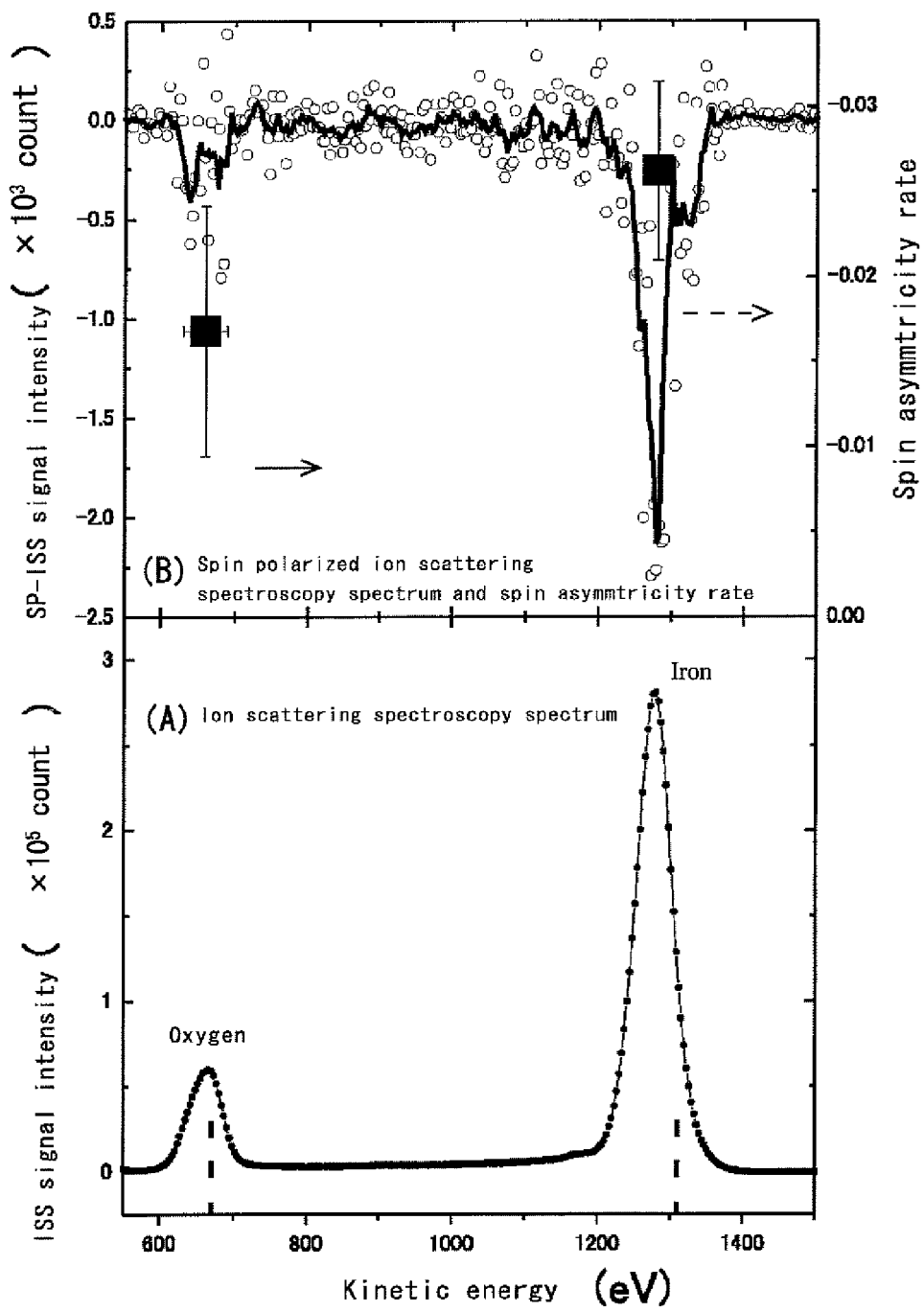
FIG. 16 illustrate graphs in the surface of the iron (100) adsorbing oxygen, in which (A) illustrates an ion scattering spectroscopy (ISS) spectrum and (B) illustrates a spin polarized ion scattering spectroscopy (SP-ISS) spectrum and a spin asymmetricity rate.

FIG. 16A illustrates an ion scattering spectroscopy (ISS) spectrum in the surface of iron (100) adsorbing oxygen. FIG. 16B illustrates a spin polarized ion scattering spectroscopy (SP-ISS) spectrum and a spin asymmetricity rate in the surface of iron (100) adsorbing oxygen. The specimen 73 by growing the Fe (100) single crystal thin film onto the magnesium oxide MgO (100) single crystal substrate and exposing the substrate to oxygen was used.

The specimen 73 was fabricated by firstly growing the Fe single crystal thin film of about 50 nm having a body centered cubic structure on the MgO (001) single crystal substrate at room temperature to subsequently heat the substrate in vacuum at about 600 degrees C. for 10 minutes. Prior to the measurement, this specimen 73 was pulse magnetized in a direction along which the Fe [100] is easily magnetized. The measurement was carried out with remnant magnetization. The incident helium ion had a kinetic energy of 1.7 keV, the incident angle (an angle formed by the normal line direction of the surface and beam) was 0 degree (vertical incidence), and the scattering angle was 145 degrees.

In FIG. 16A, the abscissa axis shows a kinetic energy (eV) and the ordinate axis shows an ion scattering intensity ($\times 10^5$ counts). FIG. 16A shows that the surface of the specimen 73 is composed of two elements of iron and oxygen. These peak positions corresponded to the energy calculated based on the classical binary collision of the incident ion and the target atom (shown by the broken line in FIG. 16A).

When assuming that the scattering intensity of a helium ion spin polarized in a direction parallel to the magnetization direction is $N_{He+}\uparrow$ and the scattering intensity of a helium ion spin polarized in a direction antiparallel to the magnetization direction is $N_{He+}\downarrow$, the spin polarized ion scattering spectroscopy spectrum (B) was defined as ($N_{He+}\uparrow - N_{He+}\downarrow$). The respective points show experimental values and the solid line shows an average of a neighboring 5 points. At the respective peak positions of iron and oxygen of the spectrum in FIG. 16B, significant signal intensities were obtained, showing the polarization of iron and oxygen.

Furthermore, when assuming that the incident beam has a polarization $P_{He+}$, the spin asymmetricity rate was defined by the following formula.

$$(N_{He+}\uparrow - N_{He+}\downarrow)/\{P_{He+}(N_{He+}\uparrow + N_{He+}\downarrow)\}$$

The spin asymmetricity rate was calculated with regard to iron (1272 to 1290 eV) and oxygen (630 to 690 eV), showing the spin analysis while discriminating the elements.

Figure 17:
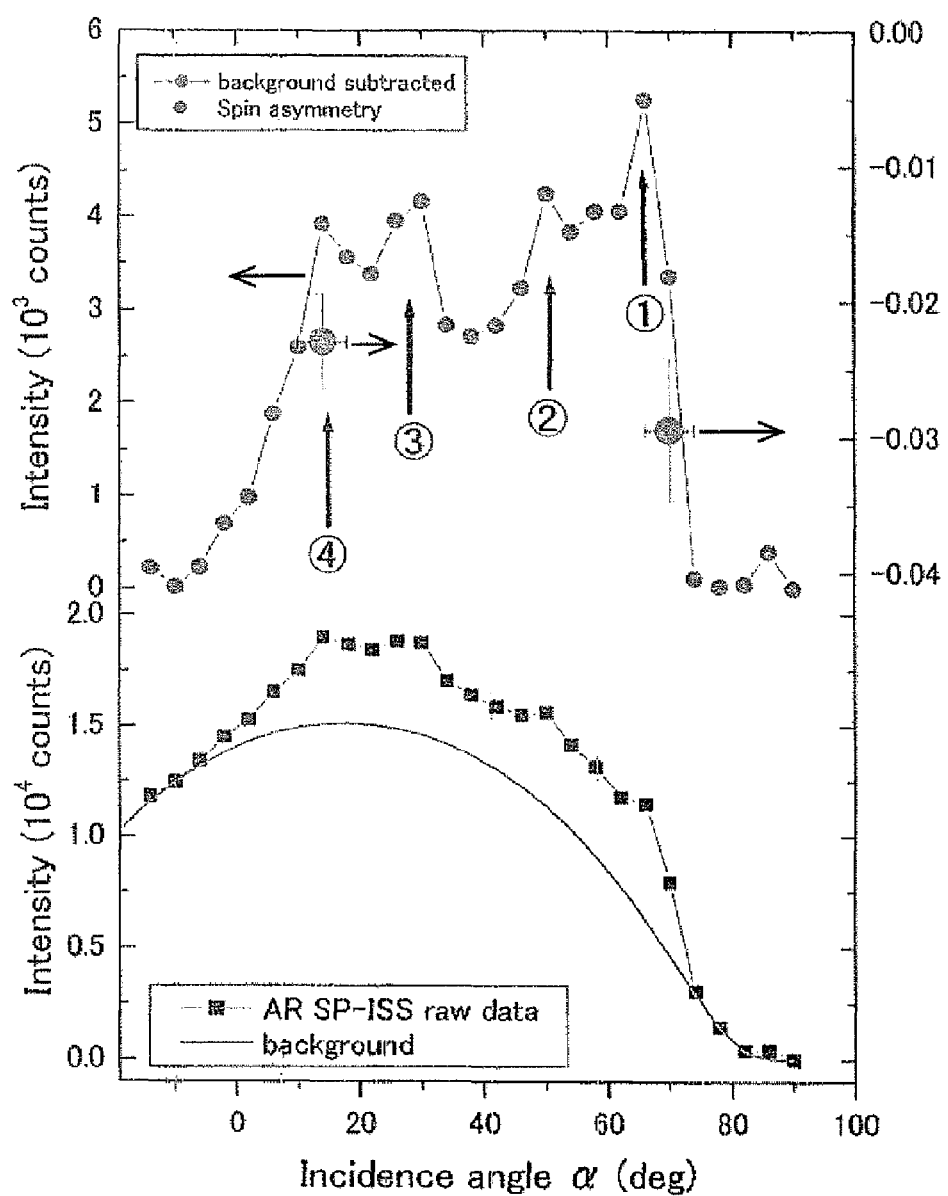
FIG. 17 is a graph showing the incident angle dependence of the spin polarized ion scattering spectroscopy in the surface of the iron (100) and also shows the spin asymmetricity rate to a specific incident angle.

FIG. 17 is a graph showing the dependency of the spin polarized ion scattering spectroscopy on an incident angle in the surface of the iron (100) and also shows the spin asymmetricity rate to a specific incident angle. In FIG. 17, the abscissa axis shows an incident angle α (degrees), the left ordinate axis shows an ion scattering intensity ($\times 10^3$ counts), and the right ordinate axis shows a spin asymmetricity rate ($\times 10^{-2}$). The spectra of FIG. 17 are shown by removing a component of the neutralization of an incident ion depending on an angle that depends on a speed component in the direction of surface normal line. The incident angle was scanned in the Fe [100] direction and the scattering angle was 145 degrees.

The resolved spectrum of the incident angle (background subtracted in FIG. 17) was obtained by removing, from the raw data obtained through the measurement (AR SP-ISS raw data in FIG. 17), the background curve calculated based on the dependency of the neutralization on the angle (background in FIG. 17) (with regard to the dependency of the neutralization on the angle, see Non Patent Document 13).

As shown in FIG. 17, the scattering intensity from iron at a clean surface of iron was investigated as a function of the incident angle. As a result, the peaks (1), (2), (3) and (4) in the angle resolved spectrum were found to be obtained by the focusing effect to iron atom positioned at the first layer (the outermost layer), the second layer, the third layer and the third layer starting from the surface of the specimen 73 to the inner side, respectively.

Figure 18:
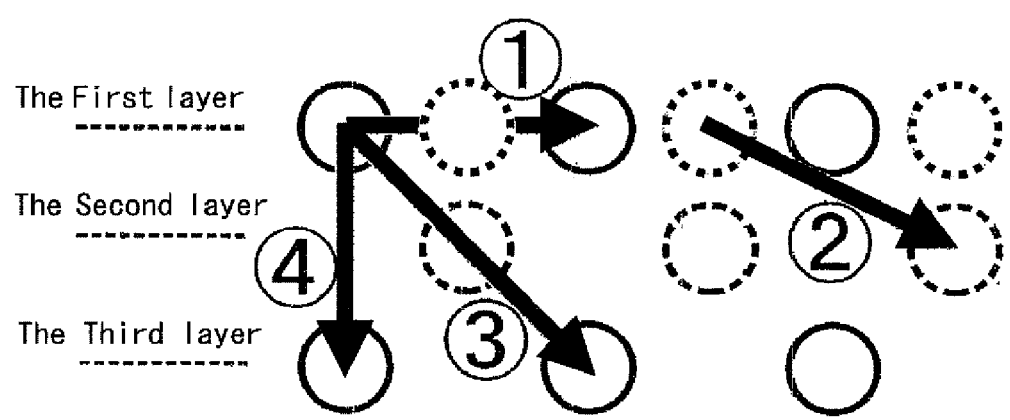
FIG. 18 illustrates a geometric relation between shadow cones and atom positions in a focusing effect corresponding to peaks (1) to (4) of FIG. 17.

FIG. 18 illustrates a geometric relation between shadow cones and atom positions in the focusing effect corresponding to the peaks (1) to (4) in FIG. 17. As shown in FIG. 18, the scattering intensity from iron at a clean surface of iron was investigated as a function of the incident angle. As a result, the peaks (1), (2), (3) and (4) in the angle resolved spectrum were obtained by the focusing effect to iron atoms positioned at the first layer (outermost layer), the second layer, the third layer, and the third layer respectively. The spin asymmetry corresponding to the incident angles of the peaks (1) and (4) corresponded to iron atoms of the first layer and the first layer to the third layer respectively and also had the same spin asymmetry.

As explained above, the directions of the spins detected by the spin polarized ion scattering spectroscopy mainly reflect the spin polarities of the occupation level in the vicinity of the Fermi level of the surface of the specimen 73.

As can be seen from the Examples, according to the SP-ISS of the present invention, the spin polarized helium ion can be used to analyze the magnetic structure in a few atomic layers at the surface of the specimen 73 as shown in Table 1.

TABLE 1

|  | ISS (conventional) | SP-ISS (the present invention) |
|---|---|---|
| Incident particles | (He⁺) ion | Polarized (He⁺) ion |
| Detected particles | Ion | Ion |
| Obtained information | Composition and structure | Magnetic structure |

The present invention is not limited to the above Examples and also can be modified in various ways within the scope of the invention disclosed in the claims. These modifications are also included in the scope of the present invention. For example, in the embodiment, the configurations of the spin polarized ion beam generation apparatus 30 and the spin polarized ion beam line 72 as well as the components thereof may be appropriately changed depending on the acceleration voltage or current of the polarized helium ion.

INDUSTRIAL APPLICABILITY

With regard to a magnetoresitance effect device using the electron spin widely used in the fields such as the electron industry such as a giant magnetoresitance effect device or a tunnel magnetoresitance effect device, the evaluation of the magnetic structure of the interface between magnetic material and non magnetic material has been required frequently. These detailed evaluations will be expected by using the spin polarized ion beam generation apparatus 30 that can generate highly polarized ion beam according to the present invention as a probe.

On the other hand, the reforming and shaping of material using ion beam have been widely carried out as typically in the ion implantation technique. The specimen processing apparatus 100 using highly polarized spin polarized ion beam enabled by the present invention can be used for the reforming of the specimen 101 and the control of the spin in a step of fabrication of a device which uses the spin conduction for example. Thus, more sophisticated functional material is expected to be realized.

This technique allows the high polarization of a metastable helium atom. Thus, this technique may be used for a magnetic resonance image by the polarized helium atom and a field using a polarized metastable helium atom such as an atomic beam lithography.

What is claimed is:

1. A spin polarized ion beam generation apparatus comprising:
    a high frequency discharge tube for ion generation;
    a laser oscillator; and
    a pumping light generator that divides a laser light from said laser oscillator to two lights of a circularly polarized first pumping light and a linearly polarized second pumping light to emit these lights to said high frequency discharge tube with an irradiation angle difference of 90 degrees therebetween, wherein
    an extraction electrode for extracting a polarized ion is provided to said high frequency discharge tube.

2. The spin polarized ion beam generation apparatus as set forth in claim 1, wherein said polarized ion beam is extracted in a direction orthogonal to both of said circularly polarized light and said linearly polarized light.

3. The spin polarized ion beam generation apparatus as set forth in claim 1, wherein said high frequency discharge tube includes a repeller electrode opposed to said extraction electrode.

4. The spin polarized ion beam generation apparatus as set forth in claim 3, wherein said extraction electrode includes a fine pore.

5. The spin polarized ion beam generation apparatus as set forth in claim 1, wherein said pumping light generator includes a circularly polarized light controller that controls said circularly polarized first pumping light in a clockwise or a counterclockwise direction.

6. The spin polarized ion beam generation apparatus as set forth in claim 1, wherein said laser oscillator outputs a laser light with a wavelength adjusted so that a polarization rate of a metastable atom as a base of an ion is maximum, said polarization rate being calculated by a measurement of absorption of a probe laser.

7. The spin polarized ion beam generation apparatus as set forth in claim 1 or 6, wherein said ion is a helium ion, said first and second pumping lights have a wavelength of a $D_0$ line, and said probe light has a wavelength of a $D_0$ line that is circularly polarized light in a counterclockwise or clockwise direction.

8. The spin polarized ion beam generation apparatus as set forth in claim 1 or 3, wherein said high frequency discharge tube has therein a helium pressure of 15 Pa or more and 50 Pa or less.

9. A spin polarized ion scattering spectroscopy apparatus comprising:
    a spin polarized ion beam generator;
    a spin polarized ion beam line that irradiates a spin polarized ion beam generated from said spin polarized ion beam generator to a specimen; and
    a measurement section that measures energy of ions scattered by interaction of said specimen with said spin polarized ion beam, wherein
    said spin polarized ion beam generator including:
    a high frequency discharge tube for ion generation;
    a laser oscillator; and
    a pumping light generator that divides a laser light from said laser oscillator to two lights of a circularly polarized first pumping light and a linearly polarized second pumping light to emit these lights to said high frequency discharge tube with an irradiation angle difference of 90 degrees therebetween, wherein
    an extraction electrode for extracting said polarized ion is provided to said high frequency discharge tube.

10. The spin polarized ion beam generation apparatus as set forth in claim 9, wherein said polarized ion beam is extracted in a direction orthogonal to both of said circularly polarized light and said linearly polarized light.

11. The spin polarized ion scattering spectroscopy apparatus as set forth in claim 9, wherein said high frequency discharge tube includes a repeller electrode opposed to said extraction electrode.

12. The spin polarized ion scattering spectroscopy apparatus as set forth in claim 11, wherein said extraction electrode includes a fine pore.

13. The spin polarized ion scattering spectroscopy apparatus as set forth in claim 9, wherein said pumping light generator includes a circularly polarized light controller that controls a circularly polarized light of said first pumping light in a clockwise or a counterclockwise direction.

14. The spin polarized ion scattering spectroscopy apparatus as set forth in claim 9, wherein said laser oscillator outputs a laser light with a wavelength adjusted so that a polarization rate of a metastable atom as a base of an ion is maximum, said polarization rate being calculated by a measurement of absorption of a probe laser.

15. The spin polarized ion scattering spectroscopy apparatus as set forth in claim 9, further comprising: a specimen stage that can control an incident angle to a spin polarized ion entering said specimen.

16. The spin polarized ion scattering spectroscopy apparatus as set forth in claim 9, wherein said spin polarized ion beam line includes a lens having a fine pore functioning as an evacuation hole and said lens is made of a non magnetic material.

17. The spin polarized ion scattering spectroscopy apparatus as set forth in claim 9 or 14, wherein said ion is a helium ion and said first and second pumping lights have a wavelength of a $D_0$ line.

18. A spin polarized ion scattering spectroscopy using the spin polarized ion scattering spectroscopy apparatus according to any of claims 9 to 16 comprising:
    a step of causing spin polarized ion to enter a specimen;
    a step of measuring scattered ions from said specimen; and a step of measuring scattered ion intensities with regard to respective spins of incident ion species to analyze a magnetic structure of a surface of said specimen based on a dependency of said specimen on a spin of a probability at which an ion enters said specimen is neutralized.

19. The spin polarized ion scattering spectroscopy as set forth in claim 18 further comprising: a step of detecting the scattered ion intensity by an electrostatic analyzer to analyze a magnetic structure of a surface said a specimen based on a difference in the scattered ion intensity depending on a direction of a spin of said ion.

20. The spin polarized ion scattering spectroscopy as set forth in claim 18, further comprising: a step of measuring a dependency of said scattered ion intensity on an incident angle of said spin polarized ion to said specimen; and a step of analyzing a spin while discriminating, based on the measurement of said scattered ion intensity, an atomic layer from an element in a direction of the depth from a surface of said specimen.

21. The spin polarized ion scattering spectroscopy as set forth in claim 18 further comprising: a step of analyzing a magnetic structure of a surface of said specimen based on a detected amount by an electrostatic analyzer before and after changing a direction of a spin of said spin polarized ion.

22. A specimen processing apparatus using spin polarized ion beam comprising:
a spin polarized ion beam generator;
a spin polarized ion beam line that irradiates a spin polarized ion beam generated from said spin polarized ion beam generator to a specimen; and
an ultrahigh vacuum chamber that is irradiated a shaped spin polarized ion beam from said spin polarized ion beam line to said specimen thereof, wherein
said spin polarized ion beam generator including:
a high frequency discharge tube for ion generation;
a laser oscillator; and
a pumping light generator that divides a laser light from said laser oscillator to two lights of a circularly polarized first pumping light and a linearly polarized second pumping light to emit these lights to said high frequency discharge tube with an irradiation angle difference of 90 degrees therebetween, wherein
an extraction electrode for extracting said polarized ion is provided to said high frequency discharge tube.

23. The specimen processing apparatus using spin polarized ion beam as set forth in claim 22, wherein said polarized ion beam is extracted in a direction orthogonal to both of said circularly polarized light and said linearly polarized light.

24. The specimen processing apparatus using spin polarized ion beam as set forth in claim 22, wherein said high frequency discharge tube includes a repeller electrode opposed to said extraction electrode.

25. The specimen processing apparatus using spin polarized ion beam as set forth in claim 22, wherein said extraction electrode includes a fine pore.

26. The specimen processing apparatus using spin polarized ion beam as set forth in claim 22, wherein said pumping light generator includes a circularly polarized light controller that controls a circularly polarized light of said first pumping light in a clockwise or a counterclockwise direction.

27. The specimen processing apparatus using spin polarized ion beam as set forth in claim 22, wherein said laser oscillator outputs laser light with a wavelength adjusted so that a polarization rate of a metastable atom as a base of an ion is maximum, said polarization rate being calculated by a measurement of absorption of a probe laser.

28. The specimen processing apparatus using spin polarized ion beam as set forth in claim 22, further compring: a specimen stage that can control an incident angle to said spin polarized ion entering said specimen.

29. The specimen processing apparatus using spin polarized ion beam as set forth in claim 22, wherein said spin polarized ion beam line includes a lens having a fine pore functioning as an evacuation hole and said lens is made of non magnetic material.

30. The specimen processing apparatus using spin polarized ion beam as set forth in claim 22 or 26, wherein said ion is a helium ion and said first and second pumping lights have a wavelength of a $D_0$ line.

* * * * *